US011531074B2

(12) United States Patent
Hoshina et al.

(10) Patent No.: US 11,531,074 B2
(45) Date of Patent: Dec. 20, 2022

(54) MEASUREMENT APPARATUS, MEASUREMENT METHOD, AND COMPUTER-READABLE RECORDING MEDIUM STORING MEASUREMENT PROGRAM

(71) Applicant: FUJITSU LIMITED, Kawasaki (JP)

(72) Inventors: Minoru Hoshina, Kawasaki (JP); Jun Fujisaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 17/476,514

(22) Filed: Sep. 16, 2021

(65) Prior Publication Data

US 2022/0236343 A1 Jul. 28, 2022

(30) Foreign Application Priority Data

Jan. 27, 2021 (JP) .............................. JP2021-011505

(51) Int. Cl.
*G01R 33/10* (2006.01)
*G01R 33/038* (2006.01)
*G01R 33/00* (2006.01)

(52) U.S. Cl.
CPC ...... *G01R 33/0385* (2013.01); *G01R 33/0011* (2013.01); *G01R 33/0017* (2013.01); *G01R 33/0064* (2013.01); *G01R 33/10* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 9,172,244 B1 * 10/2015 Ma ..................... H01L 21/8234
2011/0213510 A1 * 9/2011 Mozayeny ................ H02J 3/00
700/297
(Continued)

FOREIGN PATENT DOCUMENTS

JP 2019-215226 A 12/2019
WO 2012/157637 A1 11/2012

OTHER PUBLICATIONS

Takayuki Tokushige et al., "Estimation of Demagnetization Curve of Magnet with Nonuniform Coercivity", Journal of 2012 The Institute of Electrical Engineers of Japan., IEEJ Transactions on Fundamentals and Materials, vol. 132, No. 1, pp. 101-107, DOI: 10.1541/ieejfms.132.101 (Total 7 pages).

*Primary Examiner* — Jermele M Hollington
*Assistant Examiner* — Taqi R Nasir
(74) *Attorney, Agent, or Firm* — Fujitsu Patent Center

(57) ABSTRACT

A measurement apparatus acquires actually-measured closed magnetic path curve data, actually-measured open magnetic path curve data, and a surface magnetic property value; calculates, for each divided region obtained by sectioning and dividing the permanent magnet, by using a function including a parameter that determines distribution of magnetic property of the permanent magnet, a magnetic property value of the divided region based on an internal magnetic property value extracted from the actually-measured closed magnetic path curve data and the surface magnetic property value; calculates estimated open magnetic path curve data indicating a magnetization curve of the permanent magnet, based on a magnetic property value and the actually-measured closed magnetic path curve data; changes a value of the parameter to minimize a magnetization difference between the actually-measured open magnetic path curve data and the estimated open magnetic path (Continued)

curve data; and outputs a magnetic property value of each of the divided regions.

11 Claims, 19 Drawing Sheets

(58) Field of Classification Search
CPC .. G01R 33/307; G01R 33/60; G01R 33/0385; G01R 33/0011; G01R 33/0017; G01R 33/0064; G01R 33/10; G01V 3/32; E21B 49/08; E21B 2049/085; G01N 24/10
See application file for complete search history.

(56) References Cited

U.S. PATENT DOCUMENTS

| | | | |
|---|---|---|---|
| 2014/0046608 A1 | 2/2014 | Natsumeda | |
| 2014/0253114 A1* | 9/2014 | Khamesee | G01R 33/072 324/251 |
| 2016/0196372 A1* | 7/2016 | Fujisaki | G06F 30/20 703/2 |
| 2019/0377033 A1 | 12/2019 | Fujisaki et al. | |

* cited by examiner

FIG. 1
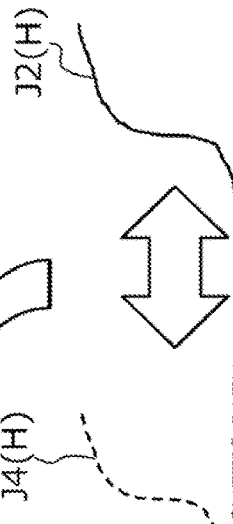
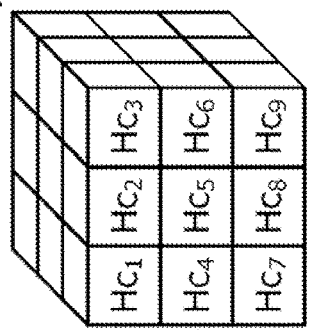
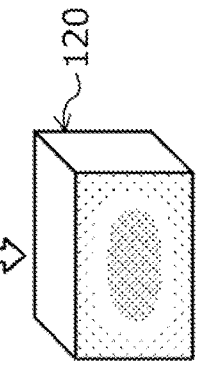

FIG. 9A
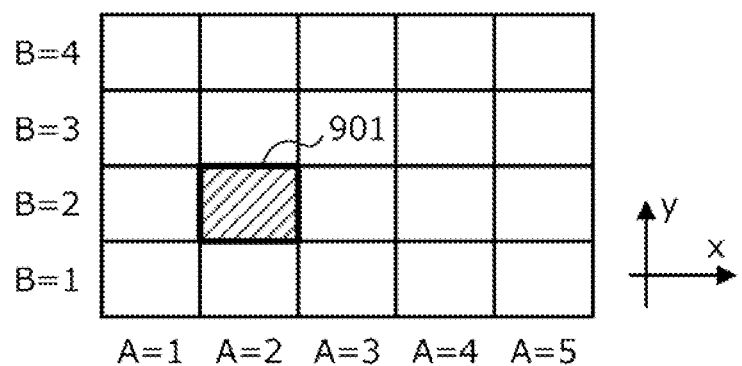
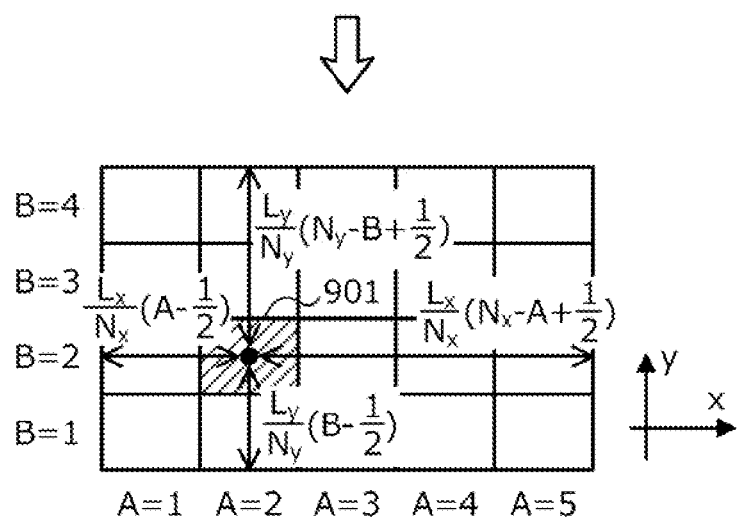

FIG. 12B
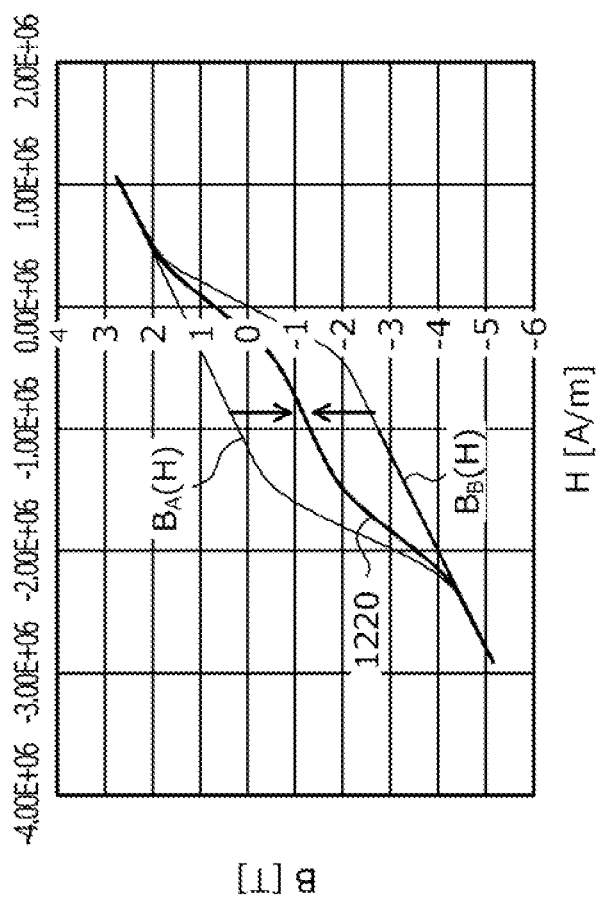
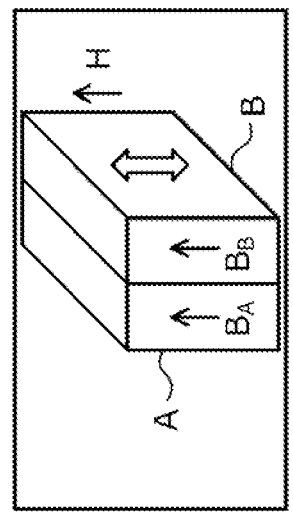

MEASUREMENT APPARATUS, MEASUREMENT METHOD, AND COMPUTER-READABLE RECORDING MEDIUM STORING MEASUREMENT PROGRAM

CROSS-REFERENCE TO RELATED APPLICATION

This application is based upon and claims the benefit of priority of the prior Japanese Patent Application No. 2021-11505, filed on Jan. 27, 2021, the entire contents of which are incorporated herein by reference.

FIELD

The embodiment discussed herein is related to a measurement apparatus, a measurement method, and a computer-readable recording medium storing measurement program.

BACKGROUND

In the related art, permanent magnets have been used in various industrial products such as motors, wind turbines, and devices. A permanent magnet has a physical quantity called magnetization, and the magnetization changes when an external magnetic field is applied. It is known that the magnetic property of a permanent magnet becomes uneven due to surface processing or grain boundary diffusion of heavy rare earth elements in a manufacturing process.

Japanese Laid-open Patent Publication No. 2019-215226 and International Publication Pamphlet No. WO 2012/157637 are disclosed as related art.

SUMMARY

According to an aspect of the embodiments, a measurement apparatus includes: a memory; and a processor coupled to the memory and configured to: acquire actually-measured closed magnetic path curve data indicating a magnetization curve of a sample with no magnetic property distribution obtained by measurement using a closed magnetic path method, actually-measured open magnetic path curve data indicating a magnetization curve of a sample with magnetic property distribution obtained by measurement using an open magnetic path method, and a surface magnetic property value of the sample with magnetic property distribution, for a permanent magnet for which magnetic property is measured; calculate, for each divided region obtained by sectioning and dividing the permanent magnet, by using a function including a parameter that determines distribution of magnetic property of the permanent magnet, a magnetic property value of the divided region based on an Internal magnetic property value extracted from the actually-measured closed magnetic path curve data and the surface magnetic property value; calculate estimated open magnetic path curve data indicating a magnetization curve of the permanent magnet obtained by measurement using an open magnetic path method, based on a magnetic property value of each of the divided regions and the actually-measured closed magnetic path curve data; change a value of the parameter so as to minimize a magnetization difference between the actually-measured open magnetic path curve data and the estimated open magnetic path curve data; and output a magnetic property value of each of the divided regions calculated by using the function including a changed value of the parameter.

The object and advantages of the Invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an explanatory diagram illustrating an example of a measurement method according to an embodiment;

FIG. 9A is an explanatory diagram (part 1) illustrating a calculation example of x;

FIG. 12B is an explanatory diagram illustrating an example of synthesizing magnetic flux density curves in a case of parallel arrangement;

DESCRIPTION OF EMBODIMENTS

Figure 2:
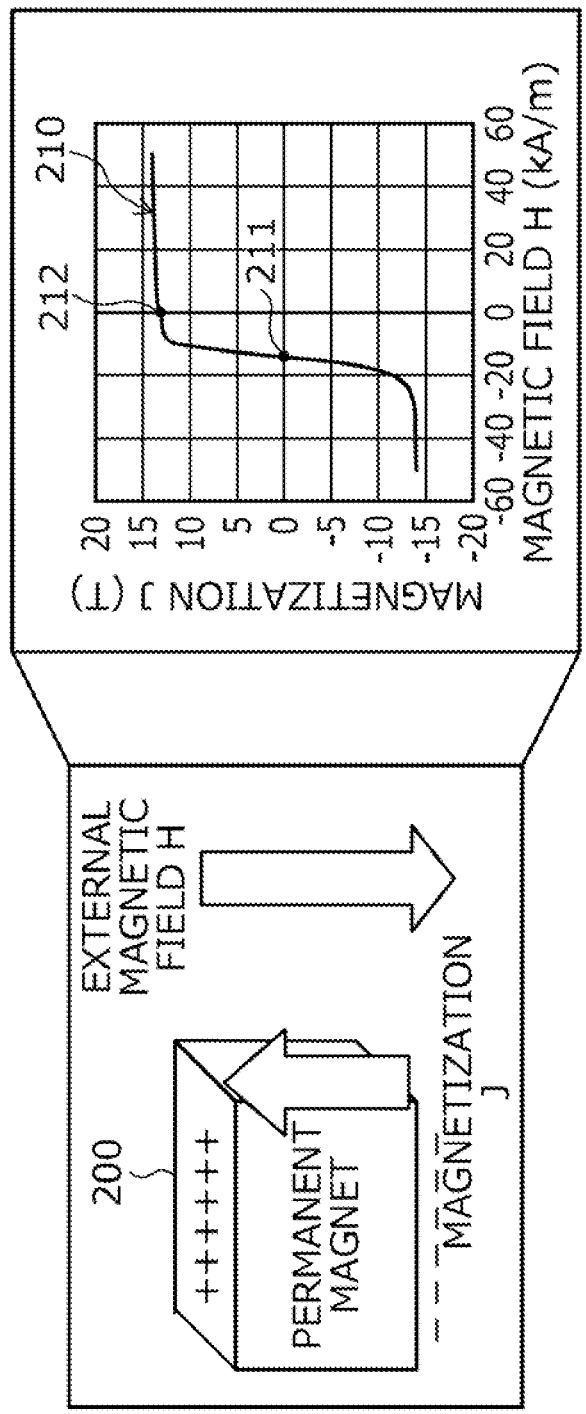
FIG. 2 is an explanatory diagram illustrating the magnetic property of a permanent magnet.

For example, there is a technique in which a function indicating second magnetization with an external magnetic field in a closed magnetic path environment is generated based on a measurement result of first magnetization in an open magnetic path environment of a permanent magnet, the function Including a parameter with a value corresponding to the external magnetic field, third magnetization in the open magnetic path environment when the external magnetic field is being affected by a demagnetizing field is calculated for each of a plurality of meshes of a mesh model of the permanent magnet, and the value of parameter corresponding to the external magnetic field is corrected based on an average of third magnetization of the plurality of meshes and the first magnetization indicated in the measurement result.

There is also a technique in which distribution of a Dy introduction amount in a magnet is calculated from shape Information of the magnet and Dy introduction surface information, distribution of $\Delta HcJ$ (amount of increase of coercive force) in the magnet is calculated from the distribution of a Dy Introduction amount, a J-H curve is calculated by using the calculated distribution of $\Delta HcJ$ for a magnet with uneven distribution of coercive force, and a demagnetizing factor at a predetermined temperature is calculated using a temperature coefficient.

However, in the related art, there is a problem in which magnetic property distribution inside a permanent magnet with an uneven magnetic property may not be measured without breaking and pulverizing the permanent magnet.

In one aspect, an object of the present disclosure is to measure magnetic property distribution inside a permanent magnet.

Hereinafter, an embodiment of a measurement apparatus, a measurement method, and a measurement program according to the present disclosure will be described in detail with reference to the drawings.

Embodiment

FIG. 1 is an explanatory diagram illustrating an example of a measurement method according to the embodiment. In FIG. 1, a measurement apparatus 101 is a computer that measures the magnetic property of a permanent magnet. A permanent magnet is an object that continues to maintain properties as a magnet for a relatively long period of time without being supplied with an external magnetic field or the like. Magnetization of a permanent magnet changes when an external magnetic field (magnetic field) is applied.

Magnetization is one of physical quantities representing the property of a permanent magnet. Magnetization is a phenomenon in which an object (magnetic body) is magnetically polarized to become a magnet when an external magnetic field is applied to the object, and represents a degree of magnetization of the object. Examples of a material of a permanent magnet include iron, cobalt, nickel, samarium, neodymium, and the like.

For example, a permanent magnet is evaluated by a magnetic property such as residual magnetization or coercive force. Residual magnetization is magnetization with zero external magnetic field, and indicates magnetization remaining when an external magnetic field is set to zero after the external magnetic field is applied to a magnetic body. Coercive force is an external magnetic field with zero magnetization, and indicates the strength of an external magnetic field in the opposite direction for changing a magnetized magnetic body back into an unmagnetized state.

With reference to FIG. 2, the magnetic property of a permanent magnet will be described.

FIG. 2 is an explanatory diagram illustrating the magnetic property of a permanent magnet. In FIG. 2, magnetization curve data 210 indicates a relationship between a magnetic field (external magnetic field H) applied to a permanent magnet 200 and magnetization J of the permanent magnet 200. Point 211 is an external magnetic field H with the magnetization J at zero, and indicates the coercive force of the permanent magnet 200. Point 212 is magnetization J with the external magnetic field H at zero, and indicates the residual magnetization of the permanent magnet 200. The magnetic property of the permanent magnet 200 is represented by the coercive force (point 211) or residual magnetization (point 212).

In the manufacturing process of a permanent magnet, the magnetic property becomes uneven due to surface processing or grain boundary diffusion of heavy rare earth elements by the Alloying Process by Grain Boundary Diffusion. For example, when an additive of a rare earth element is infiltrated from the outside of a magnet, the value of a magnetization curve changes between the surface and the inside of the magnet, and the magnetic property becomes uneven. Industrially, it is important to grasp such magnetic property distribution of a permanent magnet.

For example, magnetic property distribution of a permanent magnet is expressed by using a contour diagram. A contour diagram is a diagram in which spatial distribution of a certain physical quantity is represented by color-coding regions. On the other hand, the magnetic property of a permanent magnet is measured as an averaged property of the entire sample. Therefore, in the related art, used is a method for estimating magnetic property distribution of a permanent magnet by breaking and pulverizing a permanent magnet to be decomposed into magnet pieces, and measuring the magnetic property of each magnet piece.

However, when a permanent magnet (sample) is broken, pulverized, and decomposed for measuring magnetic property distribution of the permanent magnet, the measurement work takes much time and effort. There are also problems in which, when the decomposed magnet pieces are too small, they are largely affected by surface deterioration, and when the magnet pieces are too large, a contour diagram is displayed with low resolution.

In the present embodiment, description is given for a measurement method of measuring magnetic property distribution inside a permanent magnet with an uneven magnetic property without breaking and pulverizing the permanent magnet. Hereinafter, a processing example of the measurement apparatus 101 will be described.

(1) The measurement apparatus 101 acquires actually-measured closed magnetic path curve data of a sample with no magnetic property distribution, actually-measured open magnetic path curve data of a sample with magnetic property distribution, and the surface magnetic property value of a sample with magnetic property distribution, for a permanent magnet for which magnetic property is measured. For example, the magnetic property of a permanent magnet is represented by residual magnetization or coercive force.

The sample with no magnetic property distribution is a permanent magnet with a uniform magnetic property before the magnetic property becomes uneven in the manufacturing process of a magnet. The actually-measured closed magnetic path curve data indicates a magnetization curve of a sample with no magnetic property distribution obtained by measurement using a closed magnetic path method. A magnetization curve indicates a relationship between an external magnetic field and magnetization. The closed magnetic path method is a way of measuring magnetization in a measurement system in which a magnetic path (magnetic circuit) is closed. A BH tracer is an example of measurement by the closed magnetic path method.

The actually-measured open magnetic path curve data indicates a magnetization curve of a sample with magnetic property distribution obtained by measurement using an open magnetic path method. The open magnetic path method is a way of measuring magnetization in a measurement system in which a magnetic path (magnetic circuit) is not closed. A vibrating sample magnetometer (VSM), a pulsed field magnetometer (PFM), and the like are examples of measurement by the open magnetic path method.

The surface magnetic property value is a value of magnetic property on the surface of a sample with magnetic property distribution. For example, the surface magnetic property value is available from a catalog of a magnet manufacturer. A magnet is affected by a magnetic field (demagnetizing field) generated by its own magnetization. Since the value of demagnetizing field varies depending on the shape of a magnet and the measurement environment and a demagnetizing field is not an Inherent property of a magnet, it is desirable to exclude a demagnetizing field in the measurement for obtaining a magnetization curve.

A closed magnetic path is a measurement system capable of excluding a demagnetizing field as compared with an open magnetic path. However, since a sample with magnetic property distribution has a large coercive force, it is difficult to correctly measure the magnetic property by the closed magnetic path method due to the limitation of measurement principle. For example, magnetization of a neodymium magnet or the like is measured by the open magnetic path method since it exceeds the measurement capacity of a closed magnetic path measurement apparatus.

Therefore, actually-measured closed magnetic path curve data indicating a magnetization curve obtained by measurement using the closed magnetic path method is acquired for a sample with no magnetic property distribution, and actually-measured open magnetic path curve data indicating a magnetization curve obtained by measurement using the open magnetic path method is acquired for a sample with magnetic property distribution.

In the following description, actually-measured closed magnetic path curve data of a sample with no magnetic property distribution is referred to as "closed magnetic path curve data J1(H)" in some cases. Actually-measured open magnetic path curve data of a sample with magnetic property distribution is referred to as "open magnetic path curve data J2(H)" in some cases, and the surface magnetic property value thereof is referred to as "surface magnetic property value Hc0" in some cases.

In the example of FIG. 1, the permanent magnet for which magnetic property is measured is a "permanent magnet 110", and a case is assumed in which, for the permanent magnet 110, closed magnetic path curve data J1(H), open magnetic path curve data J2(H), and the surface magnetic property value Hc0 are acquired.

(2) The measurement apparatus 101 calculates, for each divided region obtained by sectioning and dividing a permanent magnet, by using a function including parameter κ, the magnetic property value of the divided region based on the internal magnetic property value extracted from the closed magnetic path curve data J1(H) and the surface magnetic property value Hc0. Parameter κ is a variable that determines the distribution of magnetic property of a permanent magnet.

The function including parameter κ is a function for simulating magnetic property distribution of a permanent magnet, and is, for example, a function for deriving the magnetic property of each divided region by using parameter κ, the internal magnetic property of a permanent magnet, and the surface magnetic property of the permanent magnet. For example, parameter κ is a diffusion coefficient. The function including parameter κ is a distribution function or a diffusion equation.

The internal magnetic property value extracted from the closed magnetic path curve data J1(H) indicates the magnetic property inside a sample with magnetic property distribution. For example, in the manufacturing process of a magnet, even when an additive is added from the outside of the magnet, it may be assumed that the additive does not reach the inside of the magnet. The measurement apparatus 101 treats the magnetic property of a sample with a uniform magnetic property before addition as the internal magnetic property of a sample with magnetic property distribution.

For example, the measurement apparatus 101 generates a mesh model in which a permanent magnet is virtually sectioned and divided into a plurality of regions (divided regions). The measurement apparatus 101 calculates the magnetic property value of each divided region from the function including parameter κ. For example, when a contour diagram of the magnetic property of a permanent magnet is displayed, divided regions are color-coded according to the magnetic property value of each divided region.

In the following description, a plurality of divided regions obtained by sectioning and dividing a permanent magnet are referred to as "divided regions #1 to #n" in some cases (n is a natural number of two or larger). An arbitrary divided region among the divided regions #1 to #n is referred to as "divided region #i" in some cases, and the magnetic property value of the divided region #1 is referred to as "magnetic property value $Hc_i$" in some cases. The internal magnetic property value extracted from the closed magnetic path curve data J1(H) is referred to as "internal magnetic property value Hc1" in some cases.

In the example of FIG. 1, a case is assumed in which the permanent magnet 110 is divided into three for each axis (x axis, y axis, and z axis) direction, so that the permanent magnet 110 is divided into divided regions #1 to #27.

(3) The measurement apparatus 101 calculates estimated open magnetic path curve data of a permanent magnet based on the magnetic property value $Hc_i$ of each divided region #i and the closed magnetic path curve data J1(H). The estimated open magnetic path curve data of a permanent magnet indicates a magnetization curve of a permanent magnet with magnetic property distribution obtained by measurement using the open magnetic path method.

For example, the measurement apparatus 101 calculates estimated closed magnetic path curve data of a permanent magnet based on the magnetic property value $Hc_i$ of each divided region #i and the closed magnetic path curve data J1(H). The estimated closed magnetic path curve data of a permanent magnet indicates a magnetization curve of a permanent magnet with magnetic property distribution obtained by measurement using the closed magnetic path method.

The measurement apparatus 101 converts the estimated closed magnetic path curve data of a permanent magnet into the estimated open magnetic path curve data of a permanent magnet. Mesh data of a space including a permanent magnet is used for the conversion into the estimated open magnetic path curve data. For example, mesh data is information that may specify a permanent magnet (sample with magnetic property distribution) arranged in a space and an air region other than the permanent magnet.

In the following description, estimated closed magnetic path curve data of a permanent magnet with magnetic property distribution is referred to as "closed magnetic path curve data J3(H)" in some cases, and estimated open magnetic path curve data of a permanent magnet with magnetic property distribution is referred to as "open magnetic path curve data J4(H)" in some cases.

In the example of FIG. 1, a case is assumed in which open magnetic path curve data J4(H) of the permanent magnet 110 is calculated. The open magnetic path curve data J4(H) of the permanent magnet 110 indicates a magnetization curve of the permanent magnet 110 with magnetic property distribution obtained by measurement using the open magnetic path method.

(4) The measurement apparatus 101 changes the value of parameter κ so as to minimize the magnetization difference between the open magnetic path curve data J2(H) and the open magnetic path curve data J4(H). For example, the measurement apparatus 101 uses the golden section method to search for the value of parameter κ that minimizes the magnetization difference between the open magnetic path curve data J2(H) and the open magnetic path curve data J4(H), and changes the value of parameter κ.

In the example of FIG. 1, the value of parameter κ is changed so as to minimize the magnetization difference between the open magnetic path curve data J2(H) and the open magnetic path curve data J4(H) of the permanent magnet 110.

(5) The measurement apparatus 101 outputs the magnetic property value $Hc_i$ of each divided region #i calculated by using a function including the changed value of parameter κ. For example, the measurement apparatus 101 calculates the magnetic property value $Hc_i$ of each divided region #i based on the surface magnetic property value Hc0 and the internal magnetic property value Hc1 by using the function including the changed value of parameter κ. The measurement apparatus 101 outputs the calculated magnetic property value Ho of each divided region #i.

In the example of FIG. 1, magnetic property values $Hc_1$ to $Hc_{27}$ calculated by using the function including the changed value of parameter κ are output respectively for the divided regions #1 to #27 of the permanent magnet 110.

For example, when outputting the magnetic property value $Hc_i$ of each divided region #i, the measurement apparatus 101 may output the magnetic property value $Hc_i$, calculated when searching for the value of parameter κ that minimizes the magnetization difference between the open magnetic path curve data J2(H) and the open magnetic path curve data J4(H).

As described above, the measurement apparatus 101 may estimate magnetic property distribution inside a magnet by calculating an open magnetic path magnetization curve (estimated) for the entire magnet with an uneven magnetic property from parameter κ that determines the distribution of magnetic property of a permanent magnet, comparing the open magnetic path magnetization curve with an open magnetic path magnetization curve (actually measured), and feeding back the result of comparison to parameter κ. Thus, magnetic property distribution of a permanent magnet may be measured without breaking and pulverizing the permanent magnet.

In the example of FIG. 1, the magnetic property values $Hc_1$ to $Hc_{27}$ of the divided regions #1 to #27 obtained by virtually dividing the permanent magnet 110 are obtained. With the magnetic property values $Hc_1$ to $Hc_7$ of the divided regions #1 to #27, for example, as illustrated in a contour diagram 120, magnetic property distribution inside the permanent magnet 110 may be displayed. The contour diagram 120 represents a magnetic property difference inside the permanent magnet 110 (cross section) by different background patterns.

(Example of System Configuration of Information Processing System 300)

Next, an example of system configuration of an information processing system 300 including the measurement apparatus 101 illustrated in FIG. 1 will be described. A case in which the measurement apparatus 101 illustrated in FIG. 1 is applied to an information processing apparatus 301 in the Information processing system 300 will be described as an example. For example, the information processing system 300 is applied to a service of measuring the magnetic property of a permanent magnet.

Figure 3:
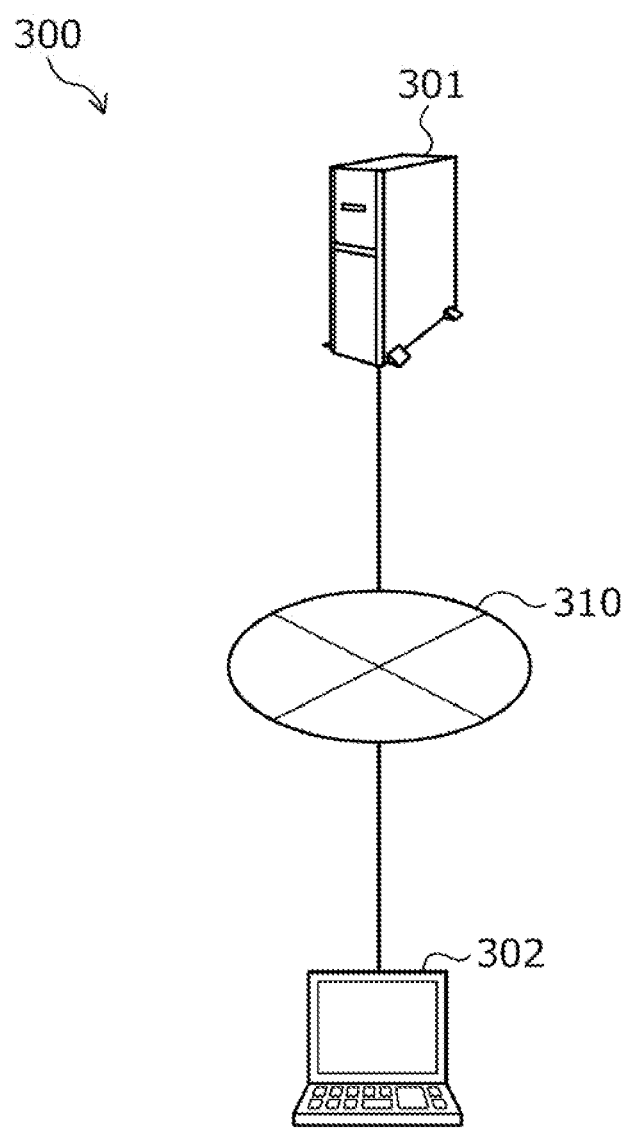
FIG. 3 is an explanatory diagram illustrating an example of system configuration of an information processing system.

FIG. 3 is an explanatory diagram illustrating an example of system configuration of the information processing system 300. In FIG. 3, the information processing system 300 includes the information processing apparatus 301 and a client apparatus 302. In the information processing system 300, the information processing apparatus 301 and the client apparatus 302 are coupled to each other via a wired or wireless network 310. For example, the network 310 is the Internet, a local area network (LAN), a wide area network (WAN), or the like.

The information processing apparatus 301 measures the magnetic property of a permanent magnet M. The permanent magnet M is a permanent magnet for which magnetic property is measured. For example, the permanent magnet M corresponds to the permanent magnet 110 illustrated in FIG. 1. For example, the information processing apparatus 301 is a server.

The client apparatus 302 is a computer used by a user of the information processing system 300. For example, the user is a designer of a permanent magnet, a designer of an industrial product using a permanent magnet, or the like. For example, the client apparatus 302 is a personal computer (PC), a tablet PC, or the like.

Although the information processing apparatus 301 and the client apparatus 302 are separately provided, this is not the only case. For example, the information processing apparatus 301 may be realized by the client apparatus 302. The Information processing system 300 may include a plurality of client apparatuses 302.

(Example of Hardware Configuration of Information Processing Apparatus 301)

Figure 4:
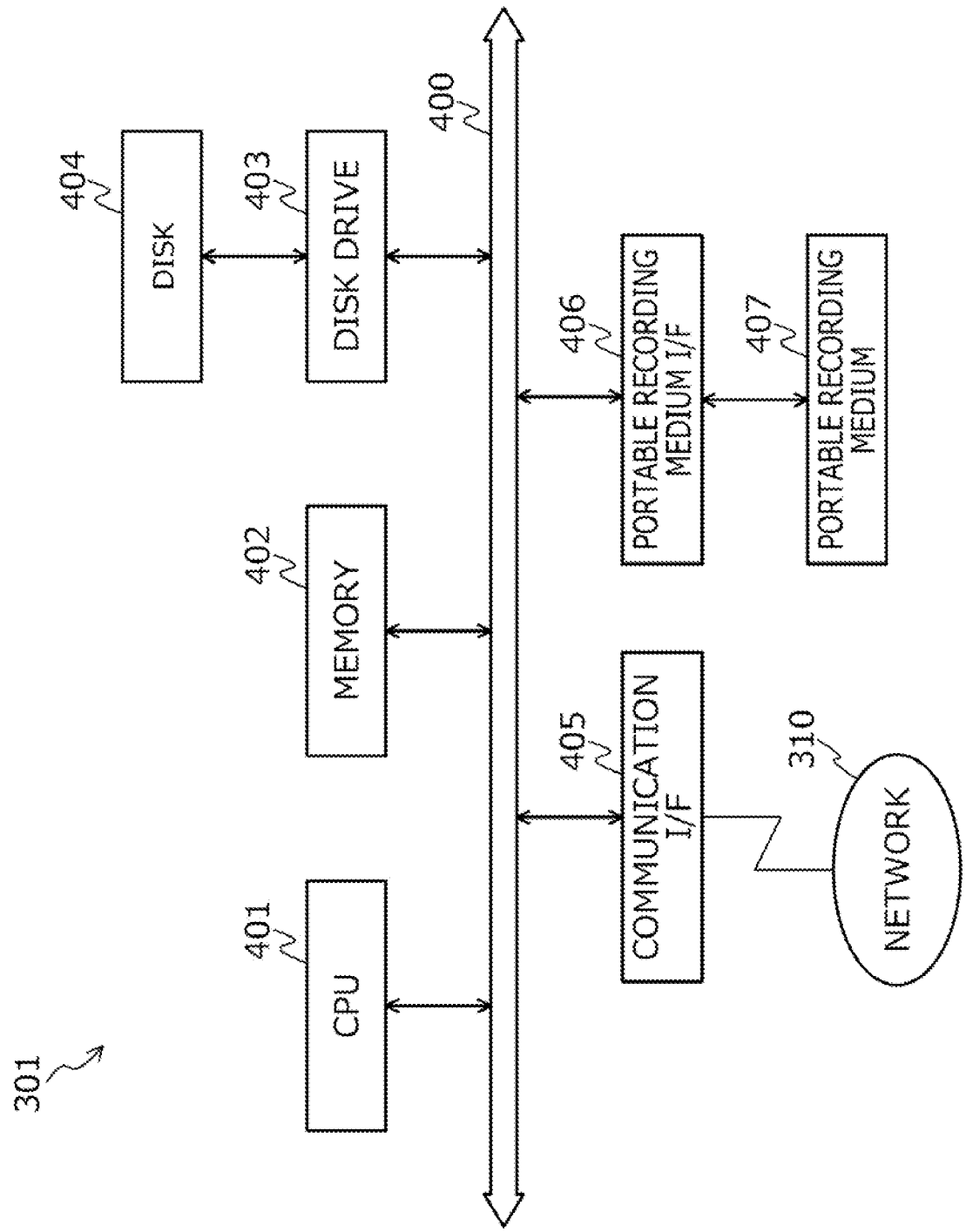
FIG. 4 is a block diagram illustrating an example of hardware configuration of an information processing apparatus.

FIG. 4 is a block diagram illustrating an example of hardware configuration of the information processing apparatus 301. In FIG. 4, the information processing apparatus 301 includes a central processing unit (CPU) 401, a memory 402, a disk drive 403, a disk 404, a communication interface (I/F) 405, a portable recording medium I/F 406, and a portable recording medium 407. These components are coupled to one another through a bus 400.

The CPU 401 controls the entirety of the information processing apparatus 301. The CPU 401 may include multiple cores. For example, the memory 402 includes a read-only memory (ROM), a random-access memory (RAM), a flash ROM, and the like. For example, the flash ROM stores a program of an operating system (OS), the ROM stores application programs, and the RAM is used as a work area of the CPU 401. The program stored in the memory 402 is loaded to the CPU 401, thereby causing the CPU 401 to execute coded processing.

The disk drive 403 controls reading and writing of data from and to the disk 404 in accordance with the control of the CPU 401. The disk 404 stores the data written under the control of the disk drive 403. Examples of the disk 404 include a magnetic disk, an optical disk, and the like.

The communication I/F 405 is coupled to the network 310 via a communication line, and is coupled to an external computer (for example, the client apparatus 302 illustrated in FIG. 3) via the network 310. The communication I/F 405 functions as an interface between the network 310 and the inside of the apparatus, and controls input and output of data to and from the external computer. For example, a modem, a LAN adapter, or the like may be adopted as the communication I/F 405.

The portable recording medium I/F 406 controls reading and writing of data from and to the portable recording medium 407 in accordance with the control of the CPU 401. The portable recording medium 407 stores the data written under the control of the portable recording medium I/F 406. Examples of the portable recording medium 407 include a compact disc read-only memory (CD-ROM), a Digital Versatile Disk (DVD), a Universal Serial Bus (USB) memory, and the like.

In addition to the above-described components, for example, the information processing apparatus 301 may include an input device, a display, and the like. The client apparatus 302 illustrated in FIG. 3 may also be realized by a hardware configuration similar to the hardware configuration of the information processing apparatus 301. However, in addition to the above-described components, for example, the client apparatus 302 includes an input device, a display, and the like.

(Specific Example of Input Data)

Next, with reference to FIGS. 5 to 7, a specific example of input data used for measuring the magnetic property of the permanent magnet M will be described.

Figure 5:
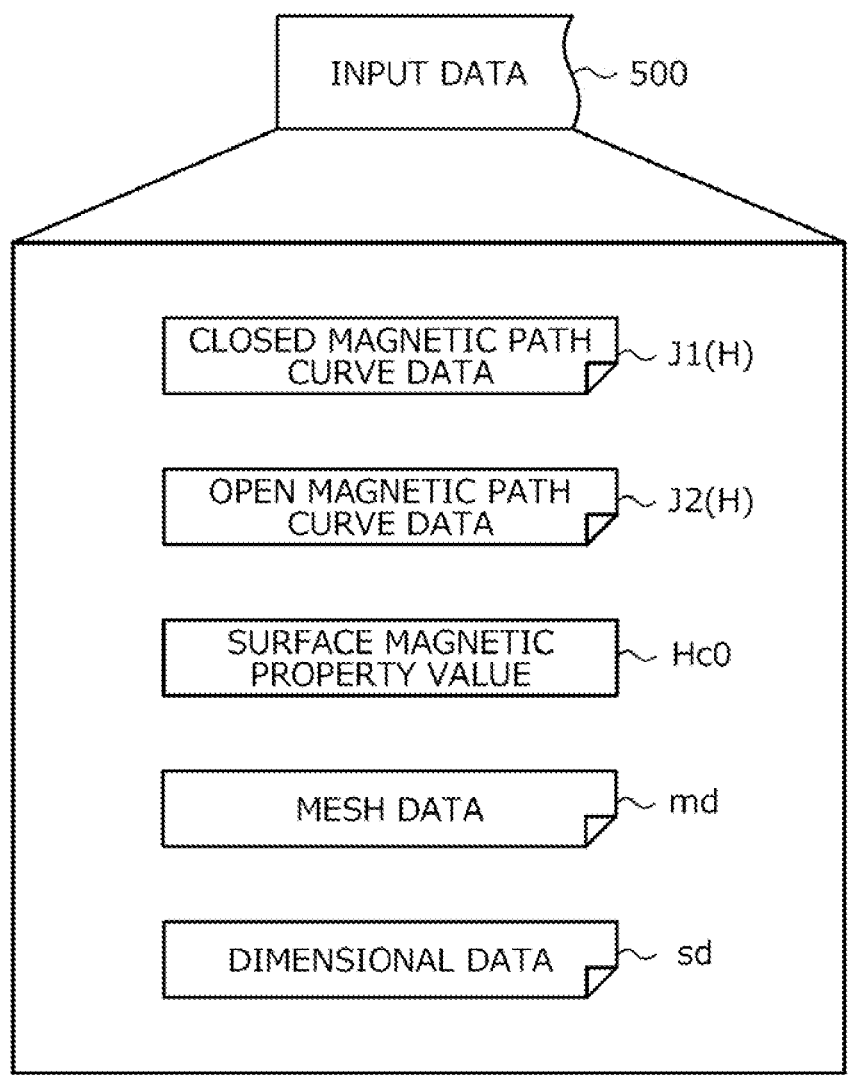
FIG. 5 is an explanatory diagram illustrating a specific example of input data.

FIG. 5 is an explanatory diagram Illustrating a specific example of input data. In FIG. 5, input data 500 includes the closed magnetic path curve data J1(H), the open magnetic path curve data J2(H), the surface magnetic property value Hc0, mesh data md, and dimensional data sd.

The closed magnetic path curve data J1(H) indicates a magnetization curve obtained by measurement using the closed magnetic path method, for a sample (permanent magnet M) with no magnetic property distribution. A specific example of the closed magnetic path curve data J1(H) will be described later with reference to FIG. 6. The open magnetic path curve data J2(H) indicates a magnetization curve obtained by measurement using the open magnetic path method, for a sample with magnetic property distribution (permanent magnet M). A specific example of open magnetic path curve data J2(H) will be described later with reference to FIG. 7.

The surface magnetic property value Hc0 indicates a magnetic property value of the surface of a sample (permanent magnet M) used for the measurement to obtain the open magnetic path curve data J2(H). For example, the surface magnetic property value Hc0 is acquired from a catalog of a magnet manufacturer. In this case, "coercive force" Is the magnetization property, and the surface magnetic property value Hc0 is "Hc0=1717 [kA/m]".

The mesh data md is mesh data including the permanent magnet M and an air region around the permanent magnet M, and is information that may specify the permanent magnet M arranged in a certain space and an air region other than the permanent magnet M. The permanent magnet M is a rectangular parallelepiped. The dimensional data sd indicates a dimension Lx in an x-axis direction, a dimension Ly in a y-axis direction, and a dimension Lz in a z-axis direction, of the permanent magnet M. In this case, the dimensions Lx, Ly, and Lz are set as "Lx=15 [mm], Ly=15 [mm], and Lz=8 [mm]". Each of the dimensions Lx, Ly, and Lz may be specified from the mesh data md.

Figure 6:
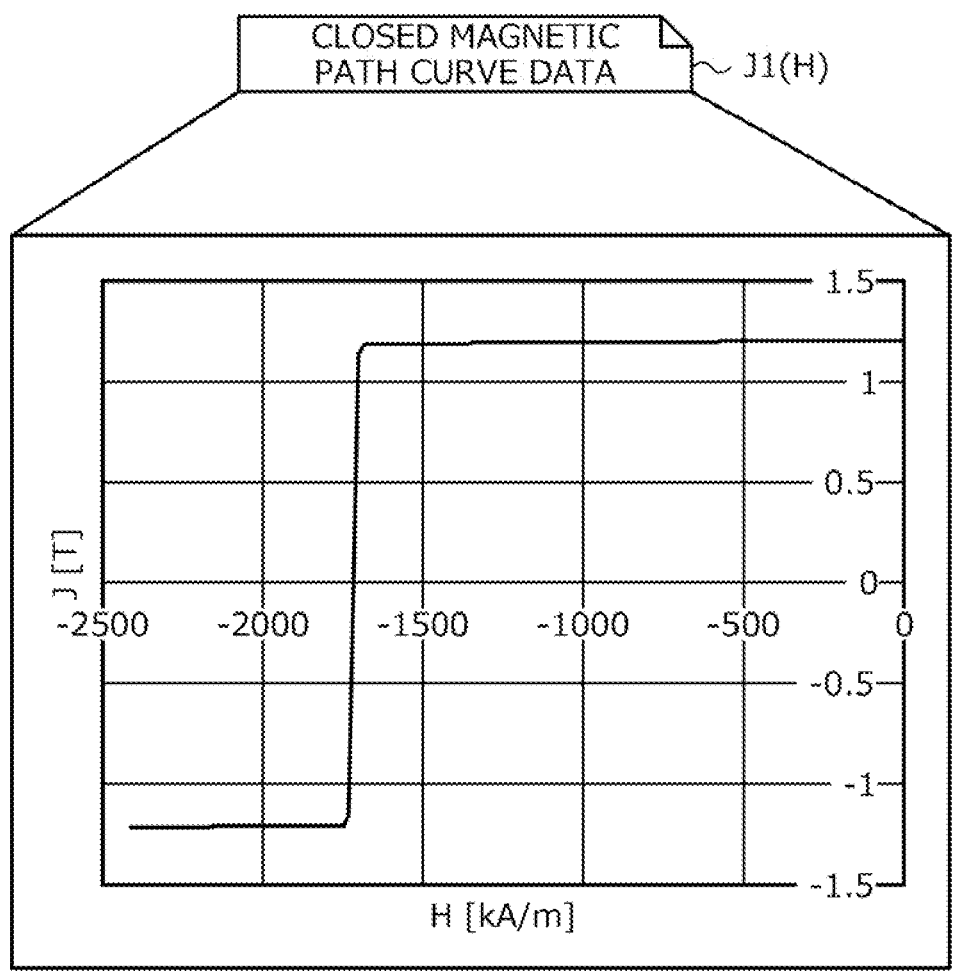
FIG. 6 is an explanatory diagram illustrating a specific example of closed magnetic path curve data.

FIG. 6 is an explanatory diagram illustrating a specific example of the closed magnetic path curve data JR(H). In FIG. 6, the closed magnetic path curve data J1(H) is information indicating a magnetization curve of a sample (permanent magnet M) with no magnetic property distribution obtained by measurement using the closed magnetic path method, and indicates a relationship between magnetic field H (kA/m) applied to the sample and magnetization J [T] of the sample.

Figure 7:
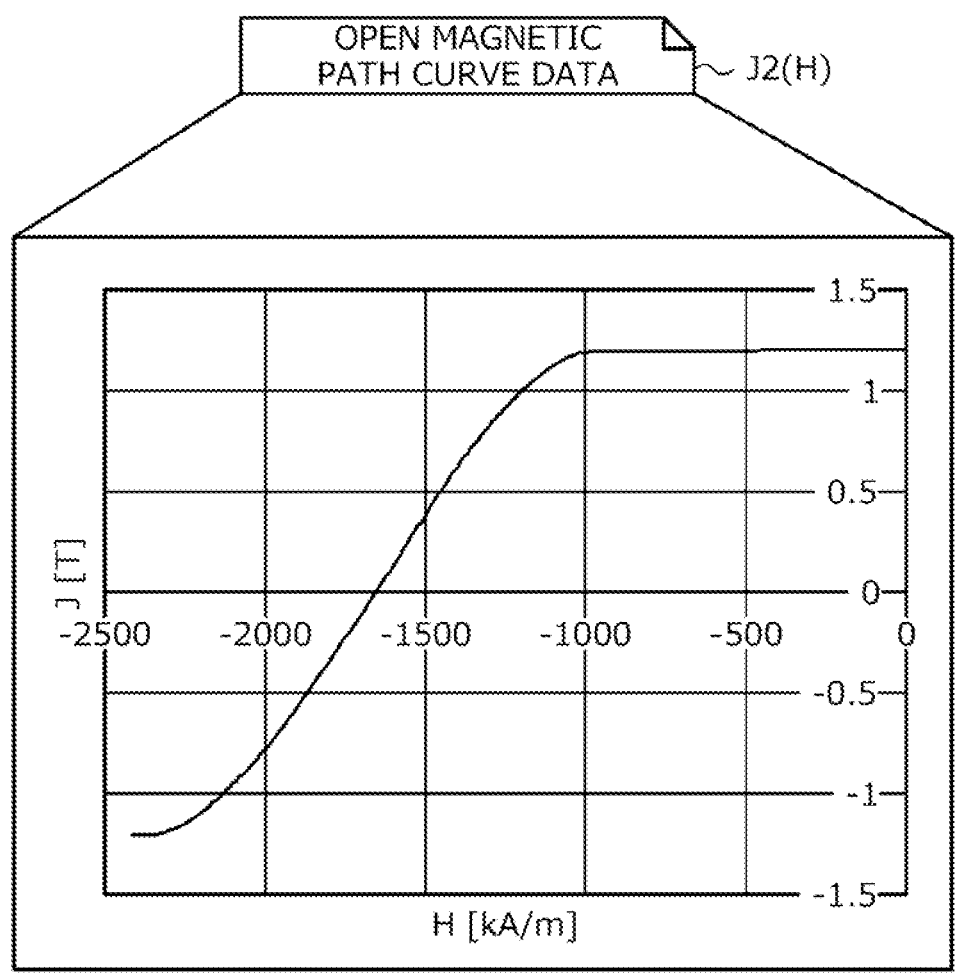
FIG. 7 is an explanatory diagram illustrating a specific example of open magnetic path curve data.

FIG. 7 is an explanatory diagram Illustrating a specific example of the open magnetic path curve data J2(H). In FIG. 7, the open magnetic path curve data J2(H) is information Indicating a magnetization curve of a sample (permanent magnet M) with magnetic property distribution obtained by measurement using the open magnetic path method, and indicates a relationship between magnetic field H (kA/m) applied to the sample and magnetization J [T] of the sample.

(Example of Functional Configuration of Information Processing Apparatus 301)

Figure 8:
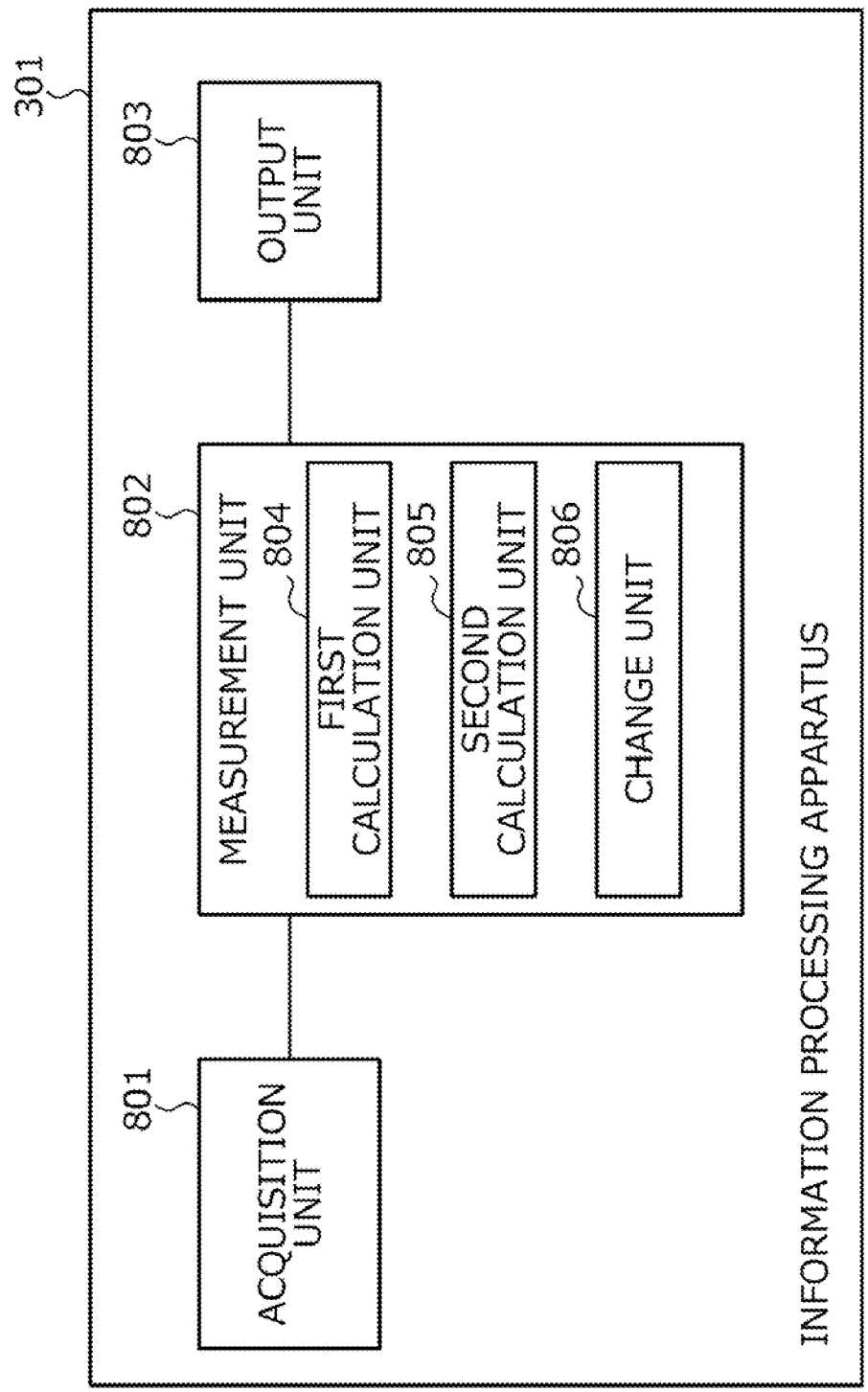
FIG. 8 is a block diagram illustrating an example of functional configuration of the information processing apparatus.

FIG. 8 is a block diagram illustrating an example of functional configuration of the information processing apparatus 301. In FIG. 8, the Information processing apparatus 301 includes an acquisition unit 801, a measurement unit 802, and an output unit 803. The acquisition unit 801, the measurement unit 802, and the output unit 803 are functions constituting a control unit. For example, the functions are realized by causing the CPU 401 to execute programs stored in the storage devices such as the memory 402, the disk 404, and the portable recording medium 407 illustrated in FIG. 4 or by using the communication I/F 405. For example, the processing result obtained by each functional unit is stored in storage devices such as the memory 402 and the disk 404.

The acquisition unit 801 acquires the closed magnetic path curve data J1(H) of a sample with no magnetic property distribution, the open magnetic path curve data J2(H) of a sample with magnetic property distribution, and the surface magnetic property value Hc0 of a sample with magnetic property distribution, for the permanent magnet M for which magnetic property is measured. The acquisition unit 801 acquires the mesh data md and the dimensional data sd for the permanent magnet M for which magnetic property is measured.

For example, by receiving the input data 500 such as that illustrated in FIG. 5 from the client apparatus 302 illustrated in FIG. 3, the acquisition unit 801 acquires the closed magnetic path curve data J1(H), the open magnetic path curve data J2(H), the surface magnetic property value Hc0, the mesh data md, and the dimensional data sd included in the input data 500.

The acquisition unit 801 may alternatively acquire the closed magnetic path curve data J1(H), the open magnetic path curve data J2(H), the surface magnetic property value Hc0, the mesh data md, and the dimensional data sd through an input operation by a user using an input device (not illustrated).

The measurement unit 802 measures the magnetic property of the permanent magnet M. For example, the magnetic property of the permanent magnet M is represented by residual magnetization or coercive force. For example, the measurement unit 802 includes a first calculation unit 804, a second calculation unit 805, and a change unit 806.

The first calculation unit 804 calculates the magnetic property value $Hc_i$ of each divided region #i obtained by sectioning and dividing the permanent magnet M. For example, the first calculation unit 804 extracts the internal magnetic property value Hc1 from the closed magnetic path curve data J1(H). For example, the first calculation unit 804 calculates the magnetic property value (the value of coercive force or residual magnetization) from the closed magnetic path curve data J1(H), and extracts the calculated magnetic property value as the internal magnetic property value Hc1.

Based on the dimensional data sd, the first calculation unit 804 generates a mesh model in which the permanent magnet M is virtually sectioned and divided into a plurality of regions (divided regions #1 to #n). The dimensional data sd indicates a dimension Lx in an x-axis direction, a dimension Ly in a y-axis direction, and a dimension Lz in a z-axis direction, of the permanent magnet M. For example, a divided region #i is a cube. The size of a divided region #i may be set arbitrarily. For example, a divided region #1 is a cube with a side of 1 [mm] or less.

The first calculation unit 804 calculates, for each divided region #i, by using a function F Including parameter κ that determines the distribution of magnetic property of the permanent magnet M, the magnetic property value $Hc_i$ of the divided region #1 based on the surface magnetic property value Hc0 and the internal magnetic property value Hc1. The function F is a function that derives the magnetic property of each divided region #i by using parameter κ, the internal magnetic property of the permanent magnet M, and the surface magnetic property of the permanent magnet M.

For example, the function F is a distribution function illustrated in the following formula (1). In the equation, Hc0 is a surface magnetic property value, Hc1 is an internal magnetic property value, κ is a diffusion coefficient (parameter), and x is a distance from the surface of a magnet.

$$Hc(x) = Hc1 + (Hc0 - Hc1)(1 - e^{-\kappa x^2}) \quad (1)$$

The first calculation unit 804 may calculate the magnetic property value $Hc_i$ of each divided region #i by substituting the surface magnetic property value Hc0, the internal magnetic property value Hc1, and the value of parameter κ (diffusion coefficient) respectively for Hc0, Hc1, and κ of the above formula (1). The initial value of parameter κ (diffusion coefficient) may be set arbitrarily.

With reference to FIG. 9A, a calculation example of x included in the above formula (1) will be described.

FIG. 9A is an explanatory diagram (part 1) illustrating a calculation example of x. In this case, a divided region #i is the A (=1, 2, ..., Nx)-th divided region in the x direction, the B (=1, 2, ..., Ny)-th divided region in the y direction, and the C(=1, 2, ..., Nz)-th divided region in the z direction. For example, the number i for a divided region #i is given by "i=Nx*Ny(C−1)+Nx(B−1)+A".

In FIG. 9A, a divided region 901 is a divided region with "A=2" and "B=2". However, FIG. 9A illustrates an Image only in the xy directions (Nx=5 and Ny=4). When calculating a distance x between the divided region 901 and the surface of a magnet, for example, the first calculation unit 804 calculates distances dx1 and dx2 from the walls in the x-axis direction by using the following formulae (2) and (3).

$$dx1 = (Lx/Nx)*(A - 1/2) \quad (2)$$

$$dx2 = (Lx/Nx)*(Nx - A + 1/2) \quad (3)$$

For example, the first calculation unit 804 calculates distances dy1 and dy2 from the walls in the y-axis direction by using the following formulae (4) and (5).

$$dy1 = (Ly/Ny)*(B - 1/2) \quad (4)$$

$$dy2 = (Ly/Ny)*(Ny - B + 1/2) \quad (5)$$

For example, the first calculation unit 804 calculates distances dz1 and dz2 from the walls in the z-axis direction by using the following formulae (6) and (7).

$$dz1 = (Lz/Nz)*(C - 1/2) \quad (6)$$

$$dz2 = (Lz/Nz)*(Nz - C + 1/2) \quad (7)$$

The first calculation unit 804 sets the smallest value among the calculated distances dx1, dx2, dy1, dy2, dz1, and dz2 as the distance x. FIG. 9A illustrates the distances dx1 and dx2 between the divided region 901 and the walls in the x-axis direction, and the distances dy1 and dy2 between the divided region 901 and the walls in the y-axis direction.

The function F may be a diffusion equation illustrated in the following equation (8). In the equation, Hc(x, t) is a magnetic property. κ is a diffusion coefficient (parameter). Hc(x, 0) is the internal magnetic property value Hc1, and indicates that a uniform coercive force Hc1 is provided at the time t=0. Hc($x_{BC}$, t) is the surface magnetic property value Hc0, and indicates that a certain coercive force Hc0 is provided on the surface of a magnet. x is the spatial coordinates of a magnet. The initial value of parameter κ (diffusion coefficient) may be set arbitrarily.

$$\frac{\partial Hc}{\partial t}(x, t) = \kappa \nabla^2 Hc(x, t) \quad (8)$$

The first calculation unit 804 may calculate the magnetic property value $Hc_i$ for a certain time of day by discretizing the differential equation of the above equation (8) into divided regions #i.

Figure 9B:
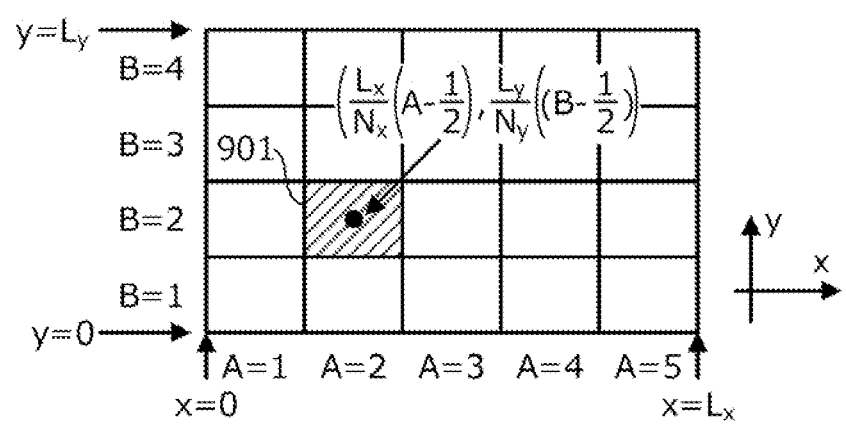
FIG. 9B is an explanatory diagram (part 2) Illustrating a calculation example of x.

With reference to FIG. 9B, a calculation example of x included in the above equation (8) will be described.

FIG. 9B is an explanatory diagram (part 2) Illustrating a calculation example of x. In this case, a divided region #i is the A (=1, 2, ..., Nx)-th divided region in the x direction, the B (=1, 2, ..., Ny)-th divided region in the y direction, and the C(=1, 2, ..., Nz)-th divided region in the z direction. For example, the number i for a divided region #i is given by "i=Nx*Ny(C−1)+Nx(B−1)+A".

In FIG. 9B, the divided region 901 is a divided region with "A=2" and "B=2". However, FIG. 9B illustrates an image only in the xy directions (Nx=5 and Ny=4). For example, the first calculation unit 804 calculates the spatial coordinates x of the divided region 901 by using the following formula (9).

$$x = \left( \frac{L_x}{N_x}\left(A - \frac{1}{2}\right), \frac{L_y}{N_y}\left(B - \frac{1}{2}\right), \frac{L_z}{N_z}\left(C - \frac{1}{2}\right) \right) \quad (9)$$

FIG. 9B illustrates only an x component and a y component of the spatial coordinates x of the divided region 901.

For example, the calculated magnetic property value $Hc_i$ of each divided region #i is stored in a divided region management table 1000 illustrated in FIG. 10 described later.

Referring back to FIG. 8, the second calculation unit 805 calculates the open magnetic path curve data J4(H) of the permanent magnet M based on the magnetic property value $Hc_i$ of each divided region #i and the closed magnetic path curve data J1(H). The open magnetic path curve data J4(H) of the permanent magnet M indicates a magnetization curve of the permanent magnet M with magnetic property distribution obtained by measurement using the open magnetic path method.

For example, the second calculation unit 805 first calculates the closed magnetic path curve data J3(H) of the permanent magnet M based on the magnetic property value $Hc_i$ of each divided region #i and the closed magnetic path curve data J1(H). The closed magnetic path curve data J3(H) indicates a magnetization curve of the permanent magnet M with magnetic property distribution obtained by measurement using the closed magnetic path method.

Specific details of processing for calculating the closed magnetic path curve data J3(H) of the permanent magnet M will be described later with reference to FIGS. 11 to 13.

Next, the second calculation unit 805 calculates the open magnetic path curve data J4(H) of the permanent magnet M based on the closed magnetic path curve data J3(H) and the mesh data md. The mesh data md is mesh data Including the permanent magnet M and an air region around the permanent magnet M. For example, the mesh data md includes attribute information for each mesh obtained by sectioning and dividing a space where the permanent magnet M is arranged into a grid shape.

For example, the second calculation unit 805 first calculates a solution J5(x, H) of the following simultaneous equations (10) to (12) based on the closed magnetic path curve data J3(H) and the mesh data md by using the Newton-Raphson method or the like. In the equations, J5(x, H) is open magnetic path curve data for each place inside a sample. x is the coordinates of a node of each mesh. $H_d(x)$ is a demagnetizing field for each place inside a sample and for each place of the air region. $\varphi(x)$ is a magnetic potential for each place inside a sample and for each place of the air region. A spatial portion (air region) other than the sample is also taken into consideration, and calculation is performed in the air region with "J5(x, H)=$H_d(x)$=0".

$$J5(x,H)=J3(H+H_d(x)) \tag{10}$$

$$\Delta\varphi(x)=\nabla \cdot J5(x,H) \tag{11}$$

$$H_d(x)=-\nabla\varphi(x) \tag{12}$$

The second calculation unit 805 calculates the open magnetic path curve data J4(H) as an average value of J5(x, H) for the entire permanent magnet M by using the following formula (13).

$$J4(H) = \frac{1}{V}\int_V J5(x, H)dx \tag{13}$$

Thus, a magnetization curve of the permanent magnet M obtained by measurement using the open magnetic path method may be estimated from the magnetic property value $Hc_i$ of each divided region #1 of the permanent magnet M.

The change unit 806 changes the value of parameter κ so as to minimize a magnetization difference r between the open magnetic path curve data J2(H) and the open magnetic path curve data J4(H). For example, the change unit 806 calculates the magnetization difference r between the open magnetic path curve data J2(H) and the open magnetic path curve data J4(H) by using the following formula (14). In the formula, j is an index for a step of magnetization curve data (j=1, 2, . . . , N). $H_j$ is an external magnetic field in each step.

$$r = \frac{1}{N}\sum_{j=1}^{N}(J2(H_j) - J4(H_j))^2 \tag{14}$$

For example, the change unit 806 changes the value of parameter κ by searching for the Δκ of "κ=κ+Δκ" so as to minimize the magnetization difference r by using the golden section method. For example, the change unit 806 changes the value of parameter κ by calculating the magnetization difference r multiple times using different values of parameter κ, and selecting the value of parameter κ obtained when the magnetization difference r is the smallest.

The measurement unit 802 controls the first calculation unit 804, the second calculation unit 805, and the change unit 806 to repeatedly perform calculation of the magnetic property value $Hc_i$ of a divided region #i, calculation of the open magnetic path curve data J4(H), and changing of the value of parameter κ until the magnetization difference r is equal to or smaller than a threshold value E. In the calculation of the magnetic property value $Hc_i$ of a divided region #i, the function F including the changed value of parameter κ is used.

The threshold value E may be set arbitrarily. For example, the threshold value E is set to such a value that the difference between the open magnetic path curve data J2(H) and the open magnetic path curve data J4(H) (corresponding to the magnetization difference r) is negligibly small. For example, the measurement unit 802 may repeatedly perform the calculation of the magnetic property value $Hc_i$ of a divided region #i, the calculation of the open magnetic path curve data J4(H), and the changing of the value of parameter κ, a predetermined number of times.

The output unit 803 outputs the magnetic property value $Hc_i$ of each divided region #i calculated by using the function F including the changed value of parameter κ. For example, when the magnetization difference r is equal to or smaller than the threshold value E, the output unit 803 outputs the magnetic property value $Hc_i$ of each divided region #i calculated by using the function F including the changed value of parameter κ.

Examples of an output form of the output unit 803 include storage in a storage device such as the memory 402 or the disk 404, transmission by the communication I/F 405 to other computers (for example, the client apparatus 302), displaying on a display (not illustrated), and outputting to a printer (not illustrated) for printing.

For example, with reference to the divided region management table 1000 illustrated in FIG. 10 described later, the output unit 803 may display a contour diagram representing magnetic property distribution of the permanent magnet M on the client apparatus 302. A specific example of a contour diagram will be described later with reference to FIG. 16.

The above-described functional units of the information processing apparatus 301 may be realized by a plurality of computers (for example, the information processing apparatus 301 and the client apparatus 302) in the information processing system 300.

(Contents Stored in Divided Region Management Table 1000)

Next, with reference to FIG. 10, contents stored in the divided region management table 1000 will be described. For example, the divided region management table 1000 is realized by a storage device such as the memory 402 or the disk 404.

Figure 10:
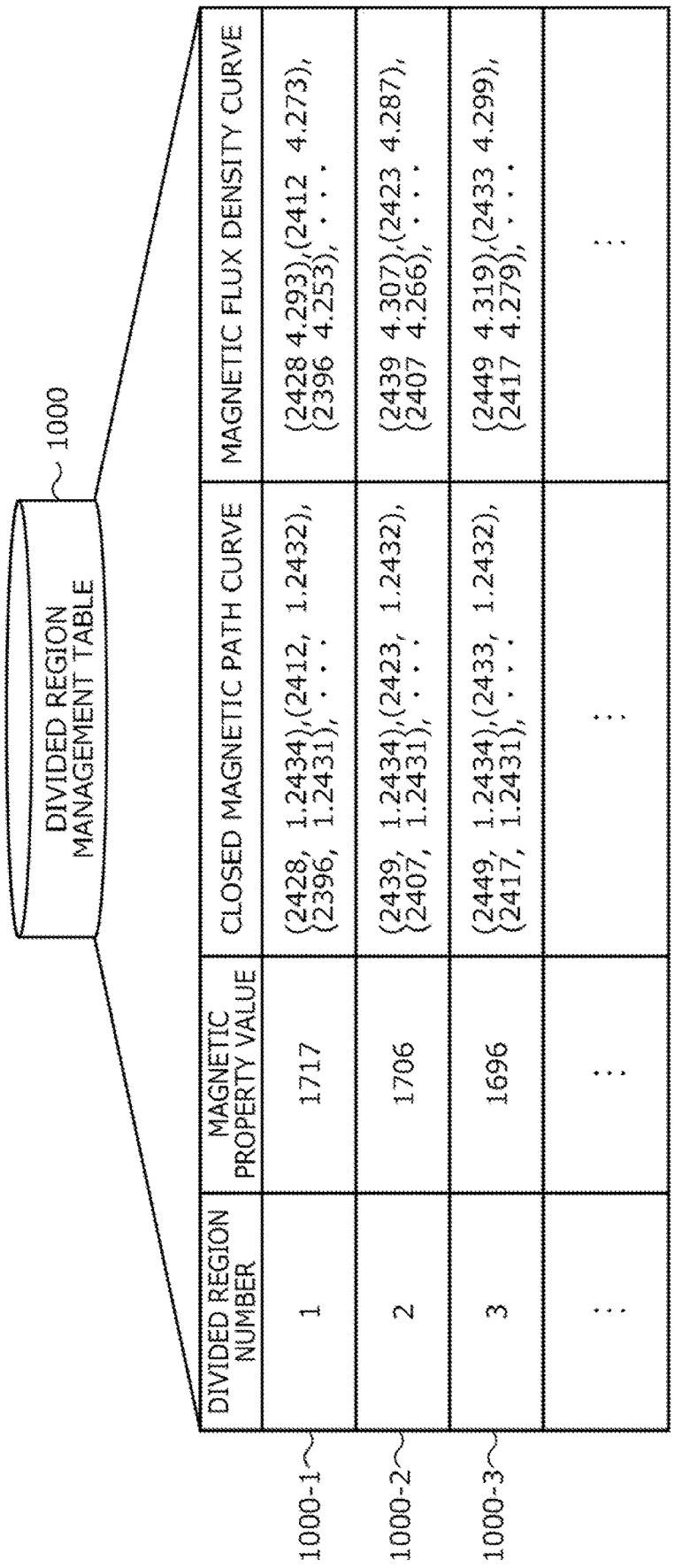
FIG. 10 is an explanatory diagram Illustrating an example of contents stored in a divided region management table.

FIG. 10 is an explanatory diagram Illustrating an example of contents stored in the divided region management table 1000. In FIG. 10, the divided region management table 1000 includes the fields of divided region number, magnetic property value, closed magnetic path curve, and magnetic flux density curve, and stores divided region management information (for example, divided region management information 1000-1 to divided region management information 1000-3) as a record by setting information in each field.

Information set in the field of divided region number indicates an identifier (i) that uniquely identifies a divided region #i obtained by sectioning and dividing the permanent magnet M. Information set in the field of magnetic property value indicates the magnetic property value $Hc_i$ of a divided region #i (unit: kA/m). Information set in the field of closed magnetic path curve indicates closed magnetic path curve data J1(H) of a divided region #1. The closed magnetic path curve data $J1_i(H)$ is a set of points (H [kA/m], J [T]).

Information set in the field of magnetic flux density curve indicates magnetic flux density curve data $B1_i(H)$ of a divided region #i. The magnetic flux density curve data $B1_i(H)$ is a set of points (H [kA/m], B [T]). For example, the information processing apparatus 301 uses the divided region management table 1000 to manage various kinds of information of each divided region #1 of the permanent magnet M.

(Specific Details of Processing for Calculating Closed Magnetic Path Curve Data J3(H))

Next, with reference to FIGS. 11 to 13, specific details of processing for calculating the closed magnetic path curve data J3(H) of the permanent magnet M will be described. First, with reference to FIG. 11, specific details of processing for calculating the closed magnetic path curve data J1(H) for each divided region #i will be described.

Figure 11:
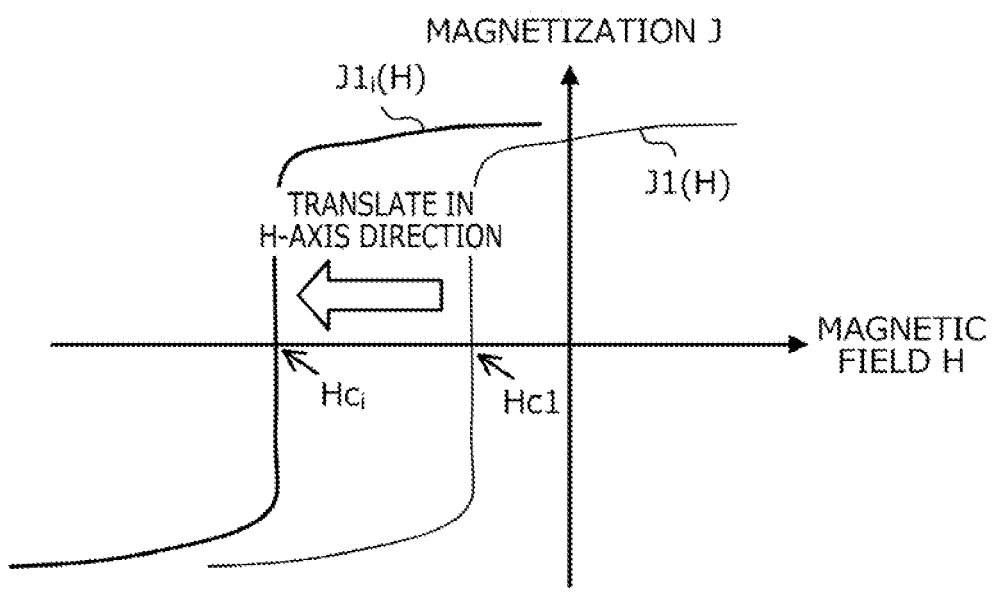
FIG. 11 is an explanatory diagram Illustrating an example of the details of processing for calculating closed magnetic path curve data of a divided region.

FIG. 11 is an explanatory diagram illustrating an example of the details of processing for calculating closed magnetic path curve data of a divided region #1. As illustrated in FIG. 11, when calculating the closed magnetic path curve data J3(H) of the permanent magnet M, the second calculation unit 805 calculates the closed magnetic path curve data $J1_i(H)$ for each divided region #1 based on the magnetic property value $Hc_i$ of each divided region #i and the closed magnetic path curve data J1(H). The closed magnetic path curve data $J1_i(H)$ indicates a magnetization curve of a divided region #i obtained by measurement using the closed magnetic path method.

For example, the second calculation unit 805 calculates the closed magnetic path curve data $J1_i(H)$ of a divided region #i by translating the closed magnetic path curve data J1(H) in a magnetic field axis direction so that the magnetic property value Hc1 (the internal magnetic property value Hc1) of the closed magnetic path curve data J1(H) is the magnetic property value $Hc_i$ of the divided region #1.

For example, the second calculation unit 805 estimates the closed magnetic path curve data $J1_i(H)$ of a divided region #i from the magnetic property value $Hc_i$ on the assumption that the shape of a magnetization curve for the divided region #i is the same as the closed magnetic path curve data J1(H) of the permanent magnet M. For example, the calculated closed magnetic path curve data $J1_i(H)$ of each divided region #i is stored in the divided region management table 1000 illustrated in FIG. 10.

Next, with reference to FIGS. 12A, 12B, and 13, specific details of processing for calculating the closed magnetic path curve data J3(H) of the permanent magnet M from the closed magnetic path curve data $J1_i(H)$ of each divided region #i will be described. A case in which a closed magnetic path curve of the entire magnet is estimated by making use of the synthesis of magnetic flux density curves of a plurality of magnets will be described.

Figure 12A:
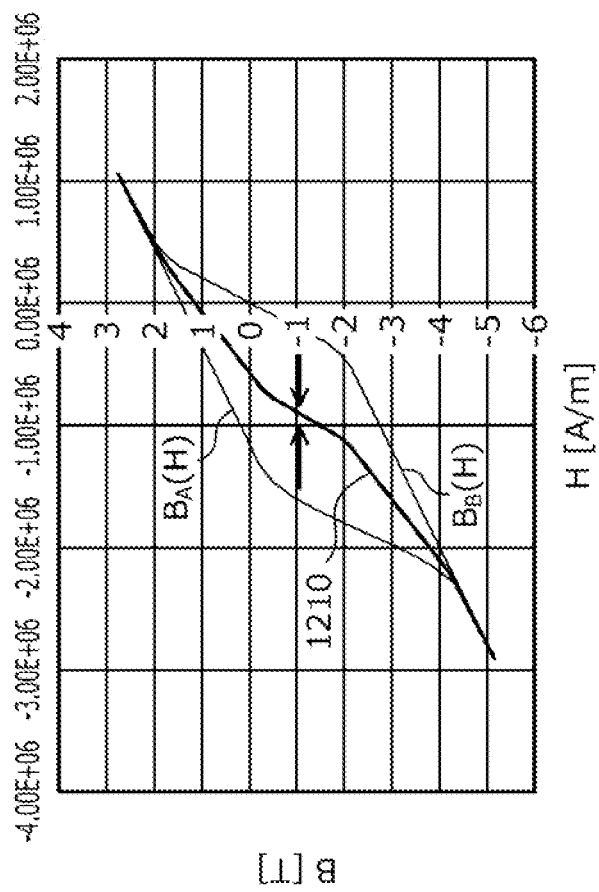
FIG. 12A is an explanatory diagram illustrating an example of synthesizing magnetic flux density curves in a case of in-line arrangement.

FIG. 12A is an explanatory diagram illustrating an example of synthesizing magnetic flux density curves in a case of in-line arrangement. As Illustrated in FIG. 12A, in a case where magnets A and B are arranged in line with respect to the direction of magnetic fields $H_A$ and $H_B$ (external magnetic field), for example, the magnetic flux density curve of the magnets A and B as a whole is calculated by synthesis formulae of the magnetic flux density curves of the magnets A and B, such as the following formulae (15) and (16). In the formula, $B_A$ is the magnetic flux density of the magnet A, and $B_B$ is the magnetic flux density of the magnet B. $V_A$ is the volume of the magnet A, and $V_B$ is the volume of the magnet B.

$$B_{synth}=B_A=B_B \tag{15}$$

$$H_{synth}=(V_A H_A+V_B H_B)/(V_A+V_B) \tag{16}$$

Using the above formulae (15) and (16), a synthesized magnetic flux density curve 1210 is calculated from a magnetic flux density curve $B_A(H)$ of the magnet A and a magnetic flux density curve $B_B(H)$ of the magnet B.

FIG. 12B is an explanatory diagram illustrating an example of synthesizing magnetic flux density curves in a case of parallel arrangement. As illustrated in FIG. 12B, in a case where the magnets A and B are arranged in parallel with respect to the direction of a magnetic field H (external magnetic field), for example, the magnetic flux density curve of the magnets A and B as a whole is calculated by synthesis formulae of the magnetic flux density curves of the magnets A and B, such as the following formulae (17) and (18).

$$B_{synth}=(V_A B_A+V_B B_B)/(V_A+V_B) \tag{17}$$

$$H_{synth}=H_A=H_B \tag{18}$$

Using the above formulae (17) and (18), a synthesized magnetic flux density curve 1220 is calculated from the magnetic flux density curve $B_A(H)$ of the magnet A and the magnetic flux density curve $B_B(H)$ of the magnet B.

Information on a technique of synthesizing magnetic flux density curves of a plurality of magnets may be found by referring to Takayuki Tokushige et al. "Estimation of Demagnetization Curve of Magnet with Nonuniform Coercivity", Journal of the Institute of Electrical Engineers of Japan A, IEEJ Trans. FM, Vol. 132, No. 1, 2012, for example.

The second calculation unit 805 estimates the closed magnetic path curve of the entire permanent magnet M from the closed magnetic path curves of the divided regions #1 to #n by making use of the synthesis of magnetic flux density curves of a plurality of magnets illustrated in FIGS. 12A and 12B.

Figure 13:
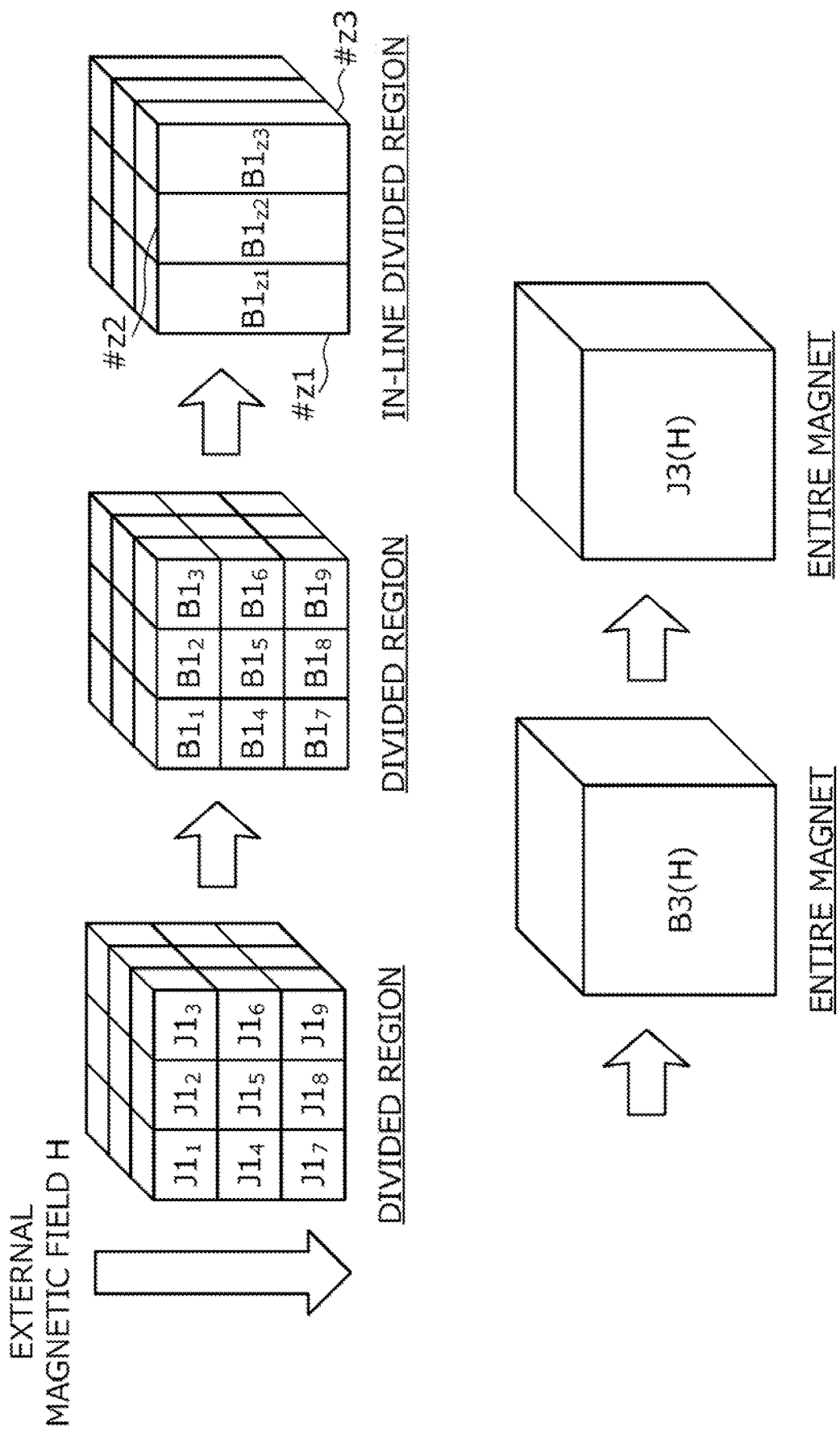
FIG. 13 is an explanatory diagram illustrating an example of the details of processing for calculating closed magnetic path curve data of a permanent magnet.

FIG. 13 is an explanatory diagram Illustrating an example of the details of processing for calculating the closed magnetic path curve data J3(H) of the permanent magnet M. In FIG. 13, the second calculation unit 805 calculates the magnetic flux density curve data $B1_i(H)$ for each divided region #i from the closed magnetic path curve data $J1_i(H)$ of each divided region #i.

For example, the second calculation unit 805 may calculate the magnetic flux density curve data $B1_i(H)$ of a divided region #i from the closed magnetic path curve data $J1_i(H)$ of the divided region #i by using the following formula (19) with reference to the divided region management table 1000. In the formula, $\mu_0$ is a vacuum magnetic permeability (constant).

$$B1_i(H)=\mu_0 H+J1_i(H) \tag{19}$$

For example, the calculated magnetic flux density curve data $B1_i(H)$ of each divided region #1 is stored in the divided region management table 1000.

Next, the second calculation unit 805 synthesizes the pieces of magnetic flux density curve data $B1_i(H)$ of divided regions #i to calculate magnetic flux density curve data $B3(H)$ of the permanent magnet M. For example, the second calculation unit 805 synthesizes pieces of magnetic flux density curve data of divided regions arranged in line in the direction of external magnetic field among the divided regions #1 to #n to calculate magnetic flux density curve data for each in-line divided region obtained by synthesizing the divided regions arranged in line.

For example, with reference to the divided region management table 1000 and using the above formulae (15) and (16), the second calculation unit 805 calculates the magnetic flux density curve data for each in-line divided region by obtaining the magnetic field H with respect to the magnetic flux density B while changing the value of magnetic flux density B. For example, the arranged position of each divided region #i of the permanent magnet M may be identified from the divided region number (i).

In the example of FIG. 13, the second calculation unit 805 synthesizes the magnetic flux density curve data $B1_1(H)$ for the divided region #1, the magnetic flux density curve data $B1_4(H)$ for the divided region #4, and the magnetic flux density curve data $B1_7(H)$ for the divided region #7, the regions being arranged in line in the direction of external magnetic field H, among the divided regions #1 to #27, to calculate magnetic flux density curve data $B1_{z1}$ for an in-line divided region #z1 obtained by synthesizing the divided regions #1, #4, and #7.

Next, the second calculation unit 805 synthesizes pieces of magnetic flux density curve data of in-line divided regions arranged in parallel in the direction perpendicular to the external magnetic field to calculate the magnetic flux density curve data $B3(H)$ of the permanent magnet M. For example, using the above formulae (17) and (18), the second calculation unit 805 calculates the magnetic flux density curve data $B3(H)$ of the permanent magnet M by obtaining the magnetic flux density B with respect to the magnetic field H while changing the value of magnetic field H.

In the example of FIG. 13, the second calculation unit 805 synthesizes pieces of magnetic flux density curve data (for example, magnetic flux density curve data $B1_{z1}$ to magnetic flux density curve data $B1_{z3}$) of a plurality of in-line divided regions (for example, in-line divided regions #z1 to #z3), to calculate the magnetic flux density curve data $B3(H)$ of the permanent magnet M.

The second calculation unit 805 calculates the closed magnetic path curve data $J3(H)$ of the permanent magnet M from the calculated magnetic flux density curve data $B3(H)$ of the permanent magnet M. For example, the second calculation unit 805 may calculate the closed magnetic path curve data $J3(H)$ of the permanent magnet M from the magnetic flux density curve data $B3(H)$ of the permanent magnet M by using the following formula (20).

$$J3(H) = B3(H) - \mu_0 H \quad (20)$$

Thus, by making use of the synthesis of magnetic flux density curves of a plurality of magnets, the closed magnetic path curve of the entire permanent magnet M may be estimated after converting the closed magnetic path curve of each divided region #i into a magnetic flux density curve.

(Specific Example of Closed Magnetic Path Curve Data $J3(H)$ of Permanent Magnet M)

Figure 14:
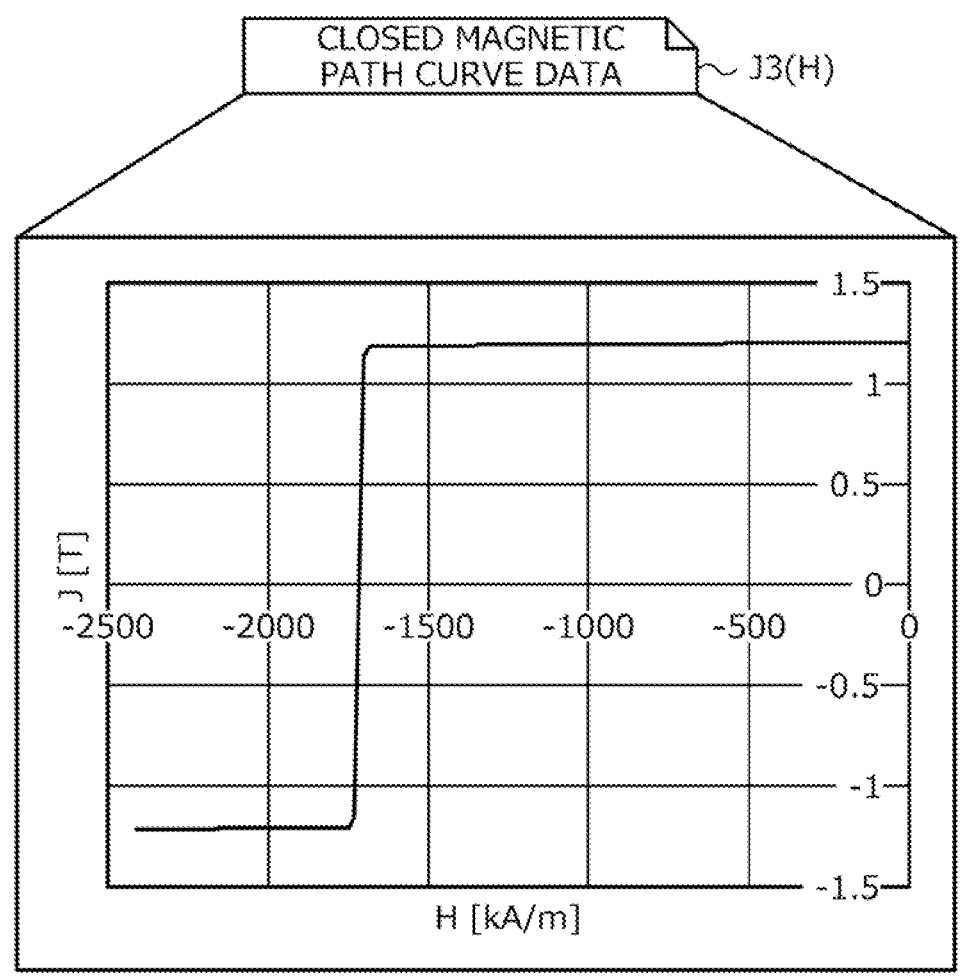
FIG. 14 is an explanatory diagram illustrating a specific example of the closed magnetic path curve data of the permanent magnet.
Figure 15:
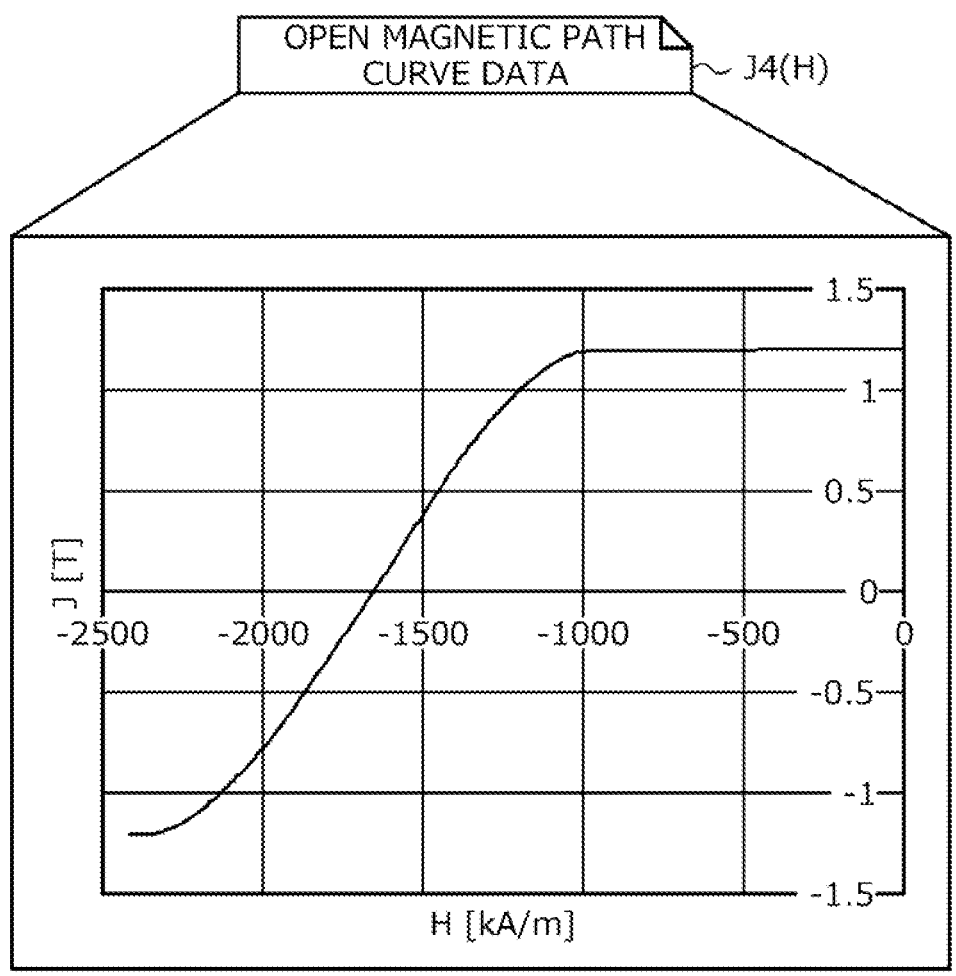
FIG. 15 is an explanatory diagram Illustrating a specific example of open magnetic path curve data of the permanent magnet.

With reference to FIG. 14, a specific example of the closed magnetic path curve data $J3(H)$ of the permanent magnet M will be described. With reference to FIG. 15, a specific example of the open magnetic path curve data $J4(H)$ of the permanent magnet M calculated from the closed magnetic path curve data $J3(H)$ of the permanent magnet M will be described.

FIG. 14 is an explanatory diagram illustrating a specific example of the closed magnetic path curve data $J3(H)$ of the permanent magnet M. In FIG. 14, the closed magnetic path curve data $J3(H)$ is information Indicating an estimation result of the magnetization curve of the permanent magnet M (a sample with magnetic property distribution) obtained by measurement using the closed magnetic path method, and indicates a relationship between magnetic field H (kA/m) applied to the permanent magnet M and magnetization J [T] of the permanent magnet M.

FIG. 15 is an explanatory diagram Illustrating a specific example of the open magnetic path curve data $J4(H)$ of the permanent magnet M. In FIG. 15, the open magnetic path curve data $J4(H)$ is information indicating an estimation result of the magnetization curve of the permanent magnet M (a sample with magnetic property distribution) obtained by measurement using the open magnetic path method, and Indicates a relationship between magnetic field H (kA/m) applied to the permanent magnet M and magnetization J [T] of the permanent magnet M.

The open magnetic path curve data $J4(H)$ of the permanent magnet M illustrated in FIG. 15 indicates an open magnetic path curve calculated from the closed magnetic path curve data $J3(H)$ of the permanent magnet M Illustrated in FIG. 14.

(Specific Example of Contour Diagram)

Next, with reference to FIG. 16, a specific example of a contour diagram will be described. For example, a contour diagram is displayed on the client apparatus 302. In this case, the magnetic property is "coercive force", the open magnetic path curve data $J2(H)$ of the permanent magnet M is the open magnetic path curve data $J2(H)$ illustrated in FIG. 7, and the surface magnetic property value Hc0 is "Hc0=1717 [kA/m]". The closed magnetic path curve data $J1(H)$ of the permanent magnet M is the closed magnetic path curve data $J1(H)$ illustrated in FIG. 6, and the internal magnetic property value Hc1 is "Hc1=1567.9 [kA/m]". The open magnetic path curve data $J4(H)$ of the permanent magnet M is the open magnetic path curve data J4H) illustrated in FIG. 15, the magnetization difference r obtained when the magnetization difference r is equal to or smaller than the threshold value E is "r=0.000235", and parameter κ is "0.28".

Figure 16:
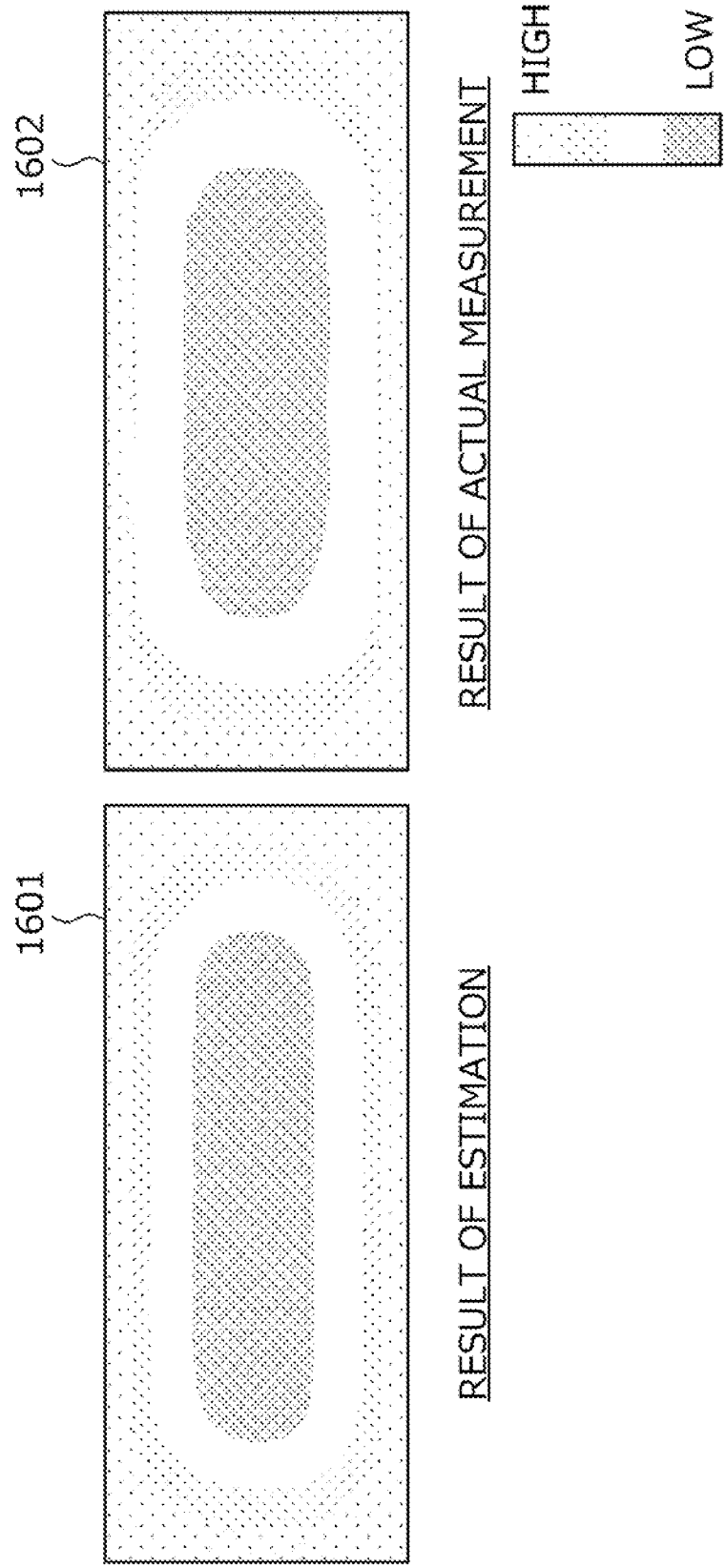
FIG. 16 is an explanatory diagram illustrating a specific example of a contour diagram.

FIG. 16 is an explanatory diagram illustrating a specific example of a contour diagram. In FIG. 16, contour diagrams 1601 and 1602 are examples of contour diagrams representing magnetic property distribution of the cross section of the permanent magnet M (15 [mm]×15 [mm]×8 [mm]). The contour diagram 1601 represents magnetic property distribution of the permanent magnet M estimated by the information processing apparatus 301.

For example, the contour diagram 1601 represents magnetic property distribution based on the magnetic property value $Hc_i$ of each divided region #i calculated by using the function F including the changed value of parameter κ and obtained when the magnetization difference r is equal to or smaller than the threshold value E. For example, the arranged position of each divided region #i of the permanent magnet M may be identified from the divided region number (i).

On the other hand, the contour diagram 1602 represents an actual measurement result obtained by breaking and pulverizing the permanent magnet M to be decomposed into magnet pieces, and measuring the magnetic property of each magnet pieces. Comparing the contour diagram 1601 with the contour diagram 1602, they are similar in the distribution of a region having a high value of magnetic property and the distribution of a region having a low value of magnetic property.

For this reason, it may be said that the contour diagram 1601 successfully reproduces the actual measurement result obtained by the measurement performed by breaking and pulverizing the permanent magnet M. The contour diagram 1601 allows a user to grasp magnetic property distribution inside the permanent magnet M without breaking and pulverizing the magnet.

(Procedure for Estimation Processing of Magnetic Property Distribution of Information Processing Apparatus 301)

Next, with reference to FIG. 17, a procedure for estimation processing of magnetic property distribution of the information processing apparatus 301 will be described.

Figure 17:
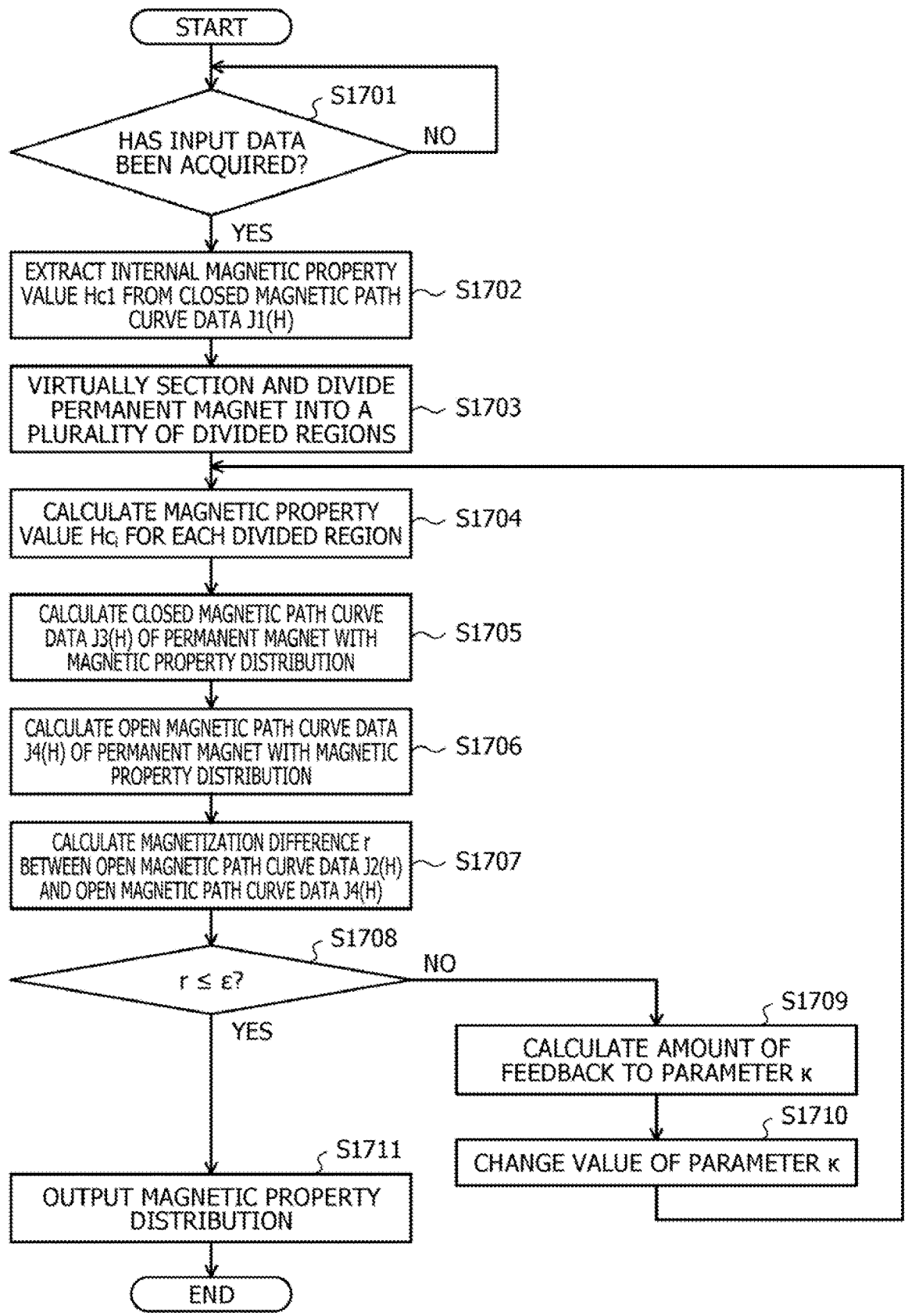
FIG. 17 is a flowchart illustrating an example of a procedure for estimation processing of magnetic property distribution of the information processing apparatus.

FIG. 17 is a flowchart illustrating an example of a procedure for estimation processing of magnetic property distribution of the information processing apparatus 301. In the flowchart illustrated in FIG. 17, the information processing apparatus 301 first determines whether input data has been acquired (step S1701). The input data includes the closed magnetic path curve data J1(H), the open magnetic path curve data J2(H), the surface magnetic property value Hc0, the mesh data md, and the dimensional data sd.

The information processing apparatus 301 waits to acquire the input data (step S1701: No). When the input data has been acquired (step S1701: Yes), the information processing apparatus 301 extracts the internal magnetic property value Hc1 from the closed magnetic path curve data J1(H) (step S1702).

Next, the information processing apparatus 301 virtually sections and divides the permanent magnet M into a plurality of regions (divided regions #1 to #n) based on the dimensional data sd (step S1703). The information processing apparatus 301 calculates the magnetic property value $Hc_i$ of each divided region #i based on the surface magnetic property value Hc0 and the internal magnetic property value Hc1 by using the function F including parameter κ (step S1704).

Next, the information processing apparatus 301 calculates the closed magnetic path curve data J3(H) of the permanent magnet M based on the magnetic property value $Hc_i$ of each divided region #i and the closed magnetic path curve data J1(H) (step S1705). The closed magnetic path curve data J3(H) indicates a magnetization curve of the permanent magnet M with magnetic property distribution obtained by measurement using the closed magnetic path method.

The information processing apparatus 301 calculates the open magnetic path curve data J4(H) of the permanent magnet M based on the closed magnetic path curve data J3(H) and the mesh data md (step S1706). The open magnetic path curve data J4(H) indicates a magnetization curve of the permanent magnet M with magnetic property distribution obtained by measurement using the open magnetic path method.

Next, the information processing apparatus 301 calculates the magnetization difference r between the open magnetic path curve data J2(H) and the open magnetic path curve data J4(H) (step S1707). The information processing apparatus 301 determines whether the calculated magnetization difference r is equal to or smaller than the threshold value E (step S1708).

When the magnetization difference r is larger than the threshold value E (step S1708: No), the information processing apparatus 301 calculates an amount of feedback U to parameter κ so as to minimize the magnetization difference r (step S1709). The information processing apparatus 301 changes the value of parameter κ by using the calculated amount of feedback Δκ (step S1710), and returns to step S1704.

On the other hand, when the magnetization difference r is equal to or smaller than the threshold value ε (step S1708: Yes), the information processing apparatus 301 outputs magnetic property distribution including the magnetic property value $Hc_i$ of each divided region #i calculated by using the function F including the changed value of parameter κ (step S1711), and ends the series of processing in the flowchart.

In this way, the information processing apparatus 301 may repeatedly perform the calculation of the magnetic property value $Hc_i$ of a divided region #i, the calculation of the closed magnetic path curve data J3(H), the calculation of the open magnetic path curve data J4(H), and the changing of the value of parameter κ until the magnetization difference r is equal to or smaller than the threshold value E. Thus, magnetic property distribution of the permanent magnet M (magnetic property values $Hc_1$ to $Hc_n$ of the divided regions #1 to #n) may be measured without breaking and pulverizing the permanent magnet M.

As described above, the information processing apparatus 301 according to the embodiment may acquire the closed magnetic path curve data J1(H), the open magnetic path curve data J2(H), and the surface magnetic property value Hc0 for a permanent magnet for which magnetic property is measured, and calculate, for each divided region #1 obtained by sectioning and dividing the permanent magnet M, by using the function F including parameter κ that determines the distribution of magnetic property of the permanent magnet M, the magnetic property value $Hc_i$ of the divided region #i based on the internal magnetic property value Hc1 extracted from the closed magnetic path curve data J1(H) and the surface magnetic property value Hc0.

Thus, magnetic property distribution of the permanent magnet M may be assumed from parameter κ that determines the distribution of magnetic property of the permanent magnet M.

The information processing apparatus 301 may calculate the open magnetic path curve data J4(H) of the permanent magnet M based on the magnetic property value $Hc_i$ of each divided region #i and the closed magnetic path curve data J1(H), change the value of parameter κ so as to minimize the magnetization difference r between the open magnetic path curve data J2(H) and the open magnetic path curve data J4(H), and output the magnetic property value $Hc_i$ of each divided region #i calculated by using the function F including the changed value of parameter κ. For example, the magnetic property of the permanent magnet M is represented by coercive force or residual magnetization of the permanent magnet M.

Thus, magnetic property distribution inside a magnet may be accurately measured by calculating an open magnetic path magnetization curve (estimated) of the entire magnet with an uneven magnetic property from magnetic property distribution assumed by using parameter κ (the magnetic property value $Hc_i$ of a divided region #i), comparing the open magnetic path magnetization curve with an open magnetic path magnetization curve (actually measured), and feeding back the result of comparison to parameter κ.

The information processing apparatus 301 may repeatedly perform calculation of the magnetic property value $Hc_i$ of a divided region #i by using the function F including the changed value of parameter κ, calculation of the open magnetic path curve data J4(H), and changing of the value of parameter κ until the magnetization difference r is equal to or smaller than the threshold value s, and output the magnetic property value Ha of each divided region #i calculated by using the function F including the changed value of parameter κ when the magnetization difference r is equal to or smaller than the threshold value ε.

Thus, the measurement accuracy of magnetic property distribution of the permanent magnet M may be Improved. For example, by repeating feedback to parameter κ until the difference between the open magnetic path curve data J2(H) and the open magnetic path curve data J4(H) is negligibly small, magnetic property distribution of the permanent magnet M equivalent to that obtained by an actual measurement may be estimated.

The information processing apparatus 301 may calculate the closed magnetic path curve data J3(H) of the permanent magnet M based on the magnetic property value $Hc_i$ of each divided region #i and the closed magnetic path curve data J1(H), and calculate the open magnetic path curve data J4(H) based on the closed magnetic path curve data J3(H) and the mesh data md.

Thus, a magnetization curve of the permanent magnet M obtained by measurement using the open magnetic path method may be estimated by estimating a magnetization curve of the permanent magnet M obtained by measurement using the closed magnetic path method and then converting the estimated magnetization curve.

The information processing apparatus 301 may calculate the closed magnetic path curve data J1(H) for each divided region #i based on the magnetic property value $Hc_i$ of each divided region #i and the closed magnetic path curve data J1(H), and calculate the magnetic flux density curve data $B1_i(H)$ for each divided region #i from the calculated closed magnetic path curve data $J1_i(H)$ of each divided region #i. The information processing apparatus 301 may synthesize the calculated pieces of magnetic flux density curve data $B1_i(H)$ of each divided region #i to calculate the magnetic flux density curve data B3(H) of the permanent magnet M, and may calculate the closed magnetic path curve data J3(H) of the permanent magnet M from the calculated magnetic flux density curve data B3(H).

Thus, by making use of the technique of synthesizing magnetic flux density curves of a plurality of magnets, the closed magnetic path curve of the entire permanent magnet M may be estimated after converting the closed magnetic path curve of each divided region #i into a magnetic flux density curve.

The information processing apparatus 301 may synthesize pieces of magnetic flux density curve data of divided regions arranged in line in the direction of external magnetic field among the divided regions #1 to #n to calculate magnetic flux density curve data for each in-line divided region obtained by synthesizing the divided regions arranged in line. The information processing apparatus 301 may synthesize pieces of magnetic flux density curve data of in-line divided regions arranged in parallel in the direction perpendicular to the external magnetic field to calculate the magnetic flux density curve data B3(H) of the permanent magnet M.

Thus, the magnetic flux density curve of the entire permanent magnet M may be accurately estimated by synthesizing the magnetic flux density curves of divided regions in consideration of the arrangement of the divided regions with respect to the direction of external magnetic field.

The information processing apparatus 301 may calculate the closed magnetic path curve data $J1_i(H)$ of a divided region #i by translating the closed magnetic path curve data J1(H) in a magnetic field axis direction so that the magnetic property value Hc1 (the internal magnetic property value Hc1) of the closed magnetic path curve data J1(H) is the magnetic property value $Hc_i$ of the divided region #i.

Thus, the closed magnetic path curve data $J1_i(H)$ of a divided region #i may be estimated from the magnetic property value $Hc_i$ on the assumption that the shape of a magnetization curve for the divided region #i is the same as the closed magnetic path curve data J1(H) of the permanent magnet M.

The information processing apparatus 301 may use a distribution function or a diffusion equation as the function F with parameter κ as a diffusion coefficient.

Thus, magnetic property distribution of the permanent magnet M including the inside thereof (magnetic property values $Hc_i$ to $Hc_n$ of the divided regions #1 to #n) may be simulated.

The information processing apparatus 301 may change the value of parameter κ so as to minimize the magnetization difference r by using the golden section method.

Thus, the value of parameter κ may be corrected so as to minimize the magnetization difference r.

From the above, the information processing apparatus 301 (measurement apparatus 101) according to the embodiment may measure magnetic property distribution of the permanent magnet M with an uneven magnetic property without breaking and pulverizing the permanent magnet M, and reduce the work load and work time for the measurement work.

The measurement method described in the present embodiment may be realized by causing a computer, such as a personal computer or a workstation, to execute a program prepared in advance. The measurement program is recorded on a computer-readable recording medium such as a hard disk, a flexible disk, a CD-ROM, a DVD, or a USB memory, and is executed by being read by the computer from the recording medium. The measurement program may also be distributed via a network such as the Internet.

The measurement apparatus 101 (Information processing apparatus 301) described in the present embodiment may also be realized by an integrated circuit (IC) for specific application, such as a standard cell or a structured application-specific integrated circuit (ASIC), or by a programmable logic device (PLD), such as a field-programmable gate array (FPGA).

All examples and conditional language provided herein are intended for the pedagogical purposes of aiding the reader in understanding the Invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present Invention have been described in detail, it should be understood that the various changes, substitutions, and alterations could be made hereto without departing from the spirit and scope of the invention.

What is claimed is:

1. A measurement apparatus comprising:
a memory; and
a processor coupled to the memory and configured to:
acquire actually-measured closed magnetic path curve data indicating a magnetization curve of a sample with no magnetic property distribution obtained by measurement using a closed magnetic path method, actually-measured open magnetic path curve data indicating a magnetization curve of a sample with magnetic property distribution obtained by measurement using an open magnetic path method, and a surface magnetic property value of the sample with magnetic property distribution, for a permanent magnet for which magnetic property is measured;
calculate, for each divided region obtained by sectioning and dividing the permanent magnet, by using a function including a parameter that determines distribution of magnetic property of the permanent magnet, a magnetic property value of the divided region based on an internal magnetic property value extracted from the actually-measured closed magnetic path curve data and the surface magnetic property value;
calculate estimated open magnetic path curve data indicating a magnetization curve of the permanent magnet obtained by measurement using an open magnetic path method, based on a magnetic property value of each of the divided regions and the actually-measured closed magnetic path curve data;
change a value of the parameter so as to minimize a magnetization difference between the actually-measured open magnetic path curve data and the estimated open magnetic path curve data; and
output a magnetic property value of each of the divided regions calculated by using the function including a changed value of the parameter.

2. The measurement apparatus according to claim 1,
wherein the processor repeatedly performs calculation of a magnetic property value of the divided region using the function including a changed value of the parameter, calculation of the estimated open magnetic path curve data, and changing of a value of the parameter until the magnetization difference is equal to or smaller than a threshold value, and
when the magnetization difference is equal to or smaller than a threshold value, outputs a magnetic property value of each of the divided regions calculated by using the function Including a changed value of the parameter.

3. The measurement apparatus according to claim 1,
wherein the processor calculates estimated closed magnetic path curve data indicating a magnetization curve of the permanent magnet obtained by measurement using a closed magnetic path method, based on a magnetic property value of each of the divided regions and the actually-measured closed magnetic path curve data, and
calculates the estimated open magnetic path curve data based on the estimated closed magnetic path curve data and mesh data of a space including the permanent magnet.

4. The measurement apparatus according to claim 3,
wherein the processor calculates closed magnetic path curve data indicating a magnetization curve for each of the divided regions obtained by measurement using a closed magnetic path method, based on a magnetic property value of each of the divided regions and the actually-measured closed magnetic path curve data,
calculates magnetic flux density curve data for each of the divided regions from calculated closed magnetic path curve data of each of the divided regions,
synthesizes calculated pieces of magnetic flux density curve data of each of the divided regions to calculate magnetic flux density curve data for the permanent magnet, and
calculates the estimated closed magnetic path curve data from calculated magnetic flux density curve data of the permanent magnet.

5. The measurement apparatus according to claim 4,
wherein the processor synthesizes pieces of magnetic flux density curve data of divided regions arranged in line in a direction of external magnetic field among the divided regions to calculate magnetic flux density curve data for each in-line divided region obtained by synthesizing the divided regions arranged in line, and
synthesizes pieces of magnetic flux density curve data of the in-line divided regions arranged in parallel in a direction perpendicular to the external magnetic field to calculate magnetic flux density curve data of the permanent magnet.

6. The measurement apparatus according to claim 4,
wherein the processor calculates closed magnetic path curve data of the divided region by translating the actually-measured closed magnetic path curve data in a magnetic field axis direction so that a magnetic property value of the actually-measured closed magnetic path curve data is a calculated magnetic property value of the divided region.

7. The measurement apparatus according to claim 1,
wherein the magnetic property is represented by coercive force or residual magnetization of the permanent magnet.

8. The measurement apparatus according to claim 1,
wherein the parameter is a diffusion coefficient, and
wherein the function is a distribution function or a diffusion equation.

9. The measurement apparatus according to claim 1,
wherein the processor changes a value of the parameter so as to minimize the magnetization difference by using a golden section method.

10. A measurement method comprising:
acquiring, by a computer, actually-measured closed magnetic path curve data indicating a magnetization curve of a sample with no magnetic property distribution obtained by measurement using a closed magnetic path method, actually-measured open magnetic path curve data indicating a magnetization curve of a sample with magnetic property distribution obtained by measurement using an open magnetic path method, and a surface magnetic property value of the sample with magnetic property distribution, for a permanent magnet for which magnetic property is measured;
calculating, for each divided region obtained by sectioning and dividing the permanent magnet, by using a function including a parameter that determines distribution of magnetic property of the permanent magnet, a magnetic property value of the divided region based on an internal magnetic property value extracted from the actually-measured closed magnetic path curve data and the surface magnetic property value;
calculating estimated open magnetic path curve data indicating a magnetization curve of the permanent magnet obtained by measurement using an open magnetic path method, based on a magnetic property value of each of the divided regions and the actually-measured closed magnetic path curve data;

changing a value of the parameter so as to minimize a magnetization difference between the actually-measured open magnetic path curve data and the estimated open magnetic path curve data; and outputting a magnetic property value of each of the divided regions calculated by using the function Including a changed value of the parameter.

11. A non-transitory computer-readable recording medium storing a measurement program causing a computer to execute a processing of:

acquiring actually-measured closed magnetic path curve data indicating a magnetization curve of a sample with no magnetic property distribution obtained by measurement using a closed magnetic path method, actually-measured open magnetic path curve data indicating a magnetization curve of a sample with magnetic property distribution obtained by measurement using an open magnetic path method, and a surface magnetic property value of the sample with magnetic property distribution, for a permanent magnet for which magnetic property is measured;

calculating, for each divided region obtained by sectioning and dividing the permanent magnet, by using a function including a parameter that determines distribution of magnetic property of the permanent magnet, a magnetic property value of the divided region based on an internal magnetic property value extracted from the actually-measured closed magnetic path curve data and the surface magnetic property value;

calculating estimated open magnetic path curve data indicating a magnetization curve of the permanent magnet obtained by measurement using an open magnetic path method, based on a magnetic property value of each of the divided regions and the actually-measured closed magnetic path curve data;

changing a value of the parameter so as to minimize a magnetization difference between the actually-measured open magnetic path curve data and the estimated open magnetic path curve data; and outputting a magnetic property value of each of the divided regions calculated by using the function including a changed value of the parameter.

* * * * *